United States Patent
Chun

(10) Patent No.: US 10,522,548 B2
(45) Date of Patent: Dec. 31, 2019

(54) SEMICONDUCTOR DEVICE AND METHOD FOR FABRICATING THE SAME

(71) Applicant: SK hynix Inc., Gyeonggi-do (KR)

(72) Inventor: Jae-Houb Chun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 44 days.

(21) Appl. No.: 15/866,635

(22) Filed: Jan. 10, 2018

(65) Prior Publication Data

US 2018/0342520 A1 Nov. 29, 2018

(30) Foreign Application Priority Data

May 26, 2017 (KR) .................. 10-2017-0065332

(51) Int. Cl.
| | |
|---|---|
| *H01L 27/108* | (2006.01) |
| *H01L 21/768* | (2006.01) |
| *H01L 49/02* | (2006.01) |
| *H01L 29/423* | (2006.01) |

(52) U.S. Cl.
CPC ...... *H01L 27/10852* (2013.01); *H01L 21/768* (2013.01); *H01L 21/76877* (2013.01); *H01L 21/76897* (2013.01); *H01L 27/10823* (2013.01); *H01L 27/10855* (2013.01); *H01L 27/10888* (2013.01); *H01L 28/91* (2013.01); *H01L 29/4236* (2013.01); *H01L 27/10814* (2013.01)

(58) Field of Classification Search
CPC ......... H01L 27/10888; H01L 27/10855; H01L 27/10814; H01L 27/10852; H01L 27/10823; H01L 28/91; H01L 29/42376; H01L 29/42377; H01L 29/4925; H01L 29/4941; H01L 21/76897; H01L 21/76877; H01L 21/768; H01L 29/42372; H01L 29/4236

See application file for complete search history.

(56) References Cited

U.S. PATENT DOCUMENTS

| | | | |
|---|---|---|---|
| 9,257,437 B2* | 2/2016 | Park | H01L 27/10885 |
| 9,627,387 B2* | 4/2017 | Jung | H01L 27/10885 |
| 2003/0082862 A1* | 5/2003 | Richter | H01L 21/26506 438/197 |
| 2013/0264638 A1 | 10/2013 | Jang et al. | |
| 2015/0162335 A1 | 6/2015 | Kim et al. | |
| 2015/0340453 A1 | 11/2015 | Cho | |
| 2016/0225710 A1* | 8/2016 | Hwang | H01L 21/02164 |
| 2016/0276273 A1* | 9/2016 | Kwon | H01L 27/1052 |
| 2016/0300842 A1 | 10/2016 | Tang et al. | |
| 2017/0005166 A1* | 1/2017 | Park | H01L 29/0649 |

* cited by examiner

*Primary Examiner* — Michael M Trinh
(74) *Attorney, Agent, or Firm* — IP & T Group LLP

(57) ABSTRACT

A method for fabricating a semiconductor device includes: forming a first conductive layer; forming a second conductive layer over the first conductive layer; forming a conductive line by etching the second conductive layer; etching a portion of the first conductive layer to form a plug head having the same critical dimension as the conductive line; forming a first spacer that covers the conductive line and the plug head; etching the remaining first conductive layer to form a plug body that is aligned with the first spacer, wherein the plug body have a greater critical dimension than the plug head; and forming a second spacer by performing a selective oxidation onto a side wall of the plug body.

20 Claims, 29 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2017-0065332, filed on May 26, 2017, which is incorporated herein by reference in its entirety.

BACKGROUND

1. Field

Exemplary embodiments of the present invention relate to a semiconductor device and, more particularly, to a semiconductor device and a method for fabricating the semiconductor device.

2. Description of the Related Art

As the integration degree of a semiconductor device is increased, the design rule for the constituent elements of the semiconductor device is decreased.

A recent trend for miniaturizing patterns makes hole spacing become narrower and narrower. Accordingly, due to high aspect ratio, process margin may be reduced rapidly.

SUMMARY

Embodiments of the present invention are directed to a semiconductor device with improved process margin, and a method for fabricating the semiconductor device.

Embodiments of the present invention are directed to a semiconductor device capable of improving an etch profile, and a method for fabricating the semiconductor device.

In accordance with an embodiment of the present invention, a method for fabricating a semiconductor device includes: forming a first conductive layer; forming a second conductive layer over the first conductive layer; forming a conductive line by etching the second conductive layer; etching a portion of the first conductive layer to form a plug head having the same critical dimension as the conductive line; forming a first spacer that covers the conductive line and the plug head; etching the remaining first conductive layer to form a plug body that is aligned with the first spacer, wherein the plug body have a greater critical dimension than the plug head; and forming a second spacer by performing a selective oxidation onto a side wall of the plug body.

The method may further include: forming a third spacer that covers the first spacer and the second spacer, after the forming of the second spacer.

The first spacer and the third spacer may be formed of a material that is different from a material of the second spacer.

The first spacer and the second spacer may be formed in the same thickness.

After the selective oxidation, the plug body and the plug head may have the same critical dimension.

The first conductive layer may include a polysilicon layer, and the second spacer may include a silicon oxide.

The first conductive layer may include a polysilicon layer, and the second conductive layer may include a metal material.

In accordance with another embodiment of the present invention, a method for fabricating a semiconductor device includes: forming a substrate structure including a contact hole; filling the contact hole with a first conductive layer; forming a second conductive layer over the first conductive layer; forming a bit line having a smaller critical dimension than a radius of the contact hole by etching the second conductive layer; etching a portion of the first conductive layer to form a plug head having the same critical dimension as the bit line; forming a first spacer that covers the bit line and the plug head; etching a remaining portion of the first conductive layer to form a plug body having a greater critical dimension than the plug head and form a gap disposed on both sides of the plug body; and forming a second spacer by performing a selective oxidation onto a side wall of the plug body.

The method may further include: forming a third spacer that covers the first spacer and the second spacer and fills the gap, after the forming of the second spacer.

The third spacer may be formed to be thicker than the first spacer and the second spacer.

The first spacer and the third spacer may include a silicon nitride, and the second spacer may include a silicon oxide.

The first spacer and the second spacer may be formed in the same thickness.

After the selective oxidation, the plug body and the plug head may have the same critical dimension.

The first conductive layer may include a polysilicon layer, and the second spacer may include a silicon oxide.

The first conductive layer may include a polysilicon layer, and the conductive layer may include a metal material.

The forming of the substrate structure including the contact hole may include: forming an inter-layer dielectric layer over a semiconductor substrate; forming an upper contact hole by etching the inter-layer dielectric layer; and forming a lower contact hole by recessing the semiconductor substrate below the upper contact hole.

The forming of the substrate structure including the contact hole may further include: forming an active region and an isolation layer in the semiconductor substrate, before the forming of the inter-layer dielectric layer; forming a gate trench that intersects with the active region and the isolation layer; forming a gate insulating layer on a surface of the gate trench; forming a buried word line that fills a portion of the gate trench over the gate insulating layer; and forming a sealing layer over the buried word line.

The method may further include: forming a storage node contact plug to be adjacent to the plug body, the plug head, and the bit line, after the forming of the third spacer that covers the first spacer and the second spacer and fills the gap; and forming a capacitor over the storage node contact plug.

The storage node contact plug may be formed by sequentially stacking a silicon plug, a metal silicide layer, and a metal plug.

The method may further include: forming a liner spacer that covers a side wall of the plug body, before the forming of the second spacer.

In accordance with yet another embodiment of the present invention, a semiconductor device includes: a substrate structure including a semiconductor substrate capped with an insulating material; an insulating layer including a contact hole extending inside the substrate structure; a contact plug formed inside the contact hole, wherein the contact plug including a plug body and a plug head disposed over the plug body; a gap defined inside the contact hole on both sides of the contact plug; a conductive line formed over and aligned with the plug head; a first spacer that is formed on both side walls of the conductive line; a second spacer that is formed on both side walls of the plug body; and a first spacer extended portion extending from the first spacer to cover a contact interface between the plug head and the conductive line.

The conductive line, the plug head, and the plug body may have the same critical dimension.

The first spacer and the second spacer may have the same thickness.

The second spacer may include an oxide that oxidizes a side wall of the plug body.

The plug body and the plug head may include polysilicon, and the second spacer may include a silicon oxide.

The first spacer may include a silicon nitride, and the second spacer may include a silicon oxide.

The semiconductor device may further include a third spacer that covers the first spacer and the second spacer.

A portion of the third spacer may be parallel to a side wall of the conductive line, and may include a third spacer extended portion which is extended to fill the gap.

The first spacer and the third spacer may include a silicon nitride, and the second spacer may include a silicon oxide.

The conductive line may include a bit line, and the plug body and the plug head may include a bit line contact plug that is coupled to the bit line.

The semiconductor device may further include: a storage node contact plug that is disposed adjacent to the bit line contact plug and the bit line; and a capacitor that is formed over the storage node contact plug.

These and other features and advantages of the present invention will become apparent to those skilled in the art to which the present invention pertains from the following detailed description in reference with the accompanying drawings.

DETAILED DESCRIPTION

Figure 1:
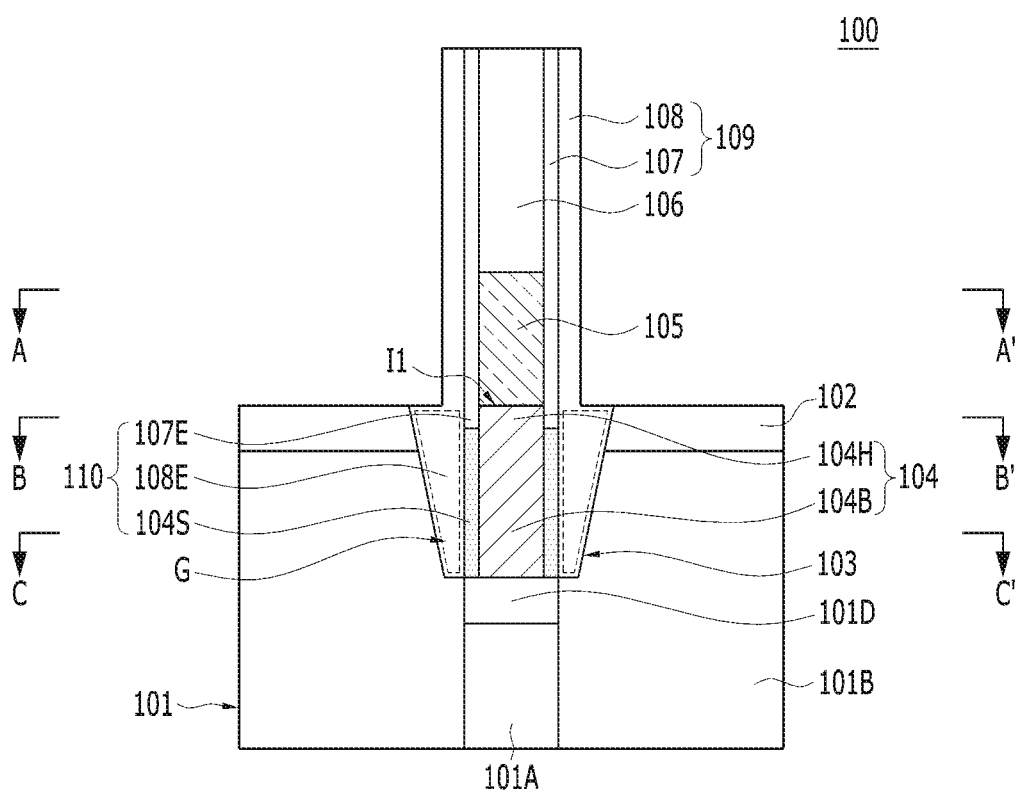
FIG. 1 is a cross-sectional view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
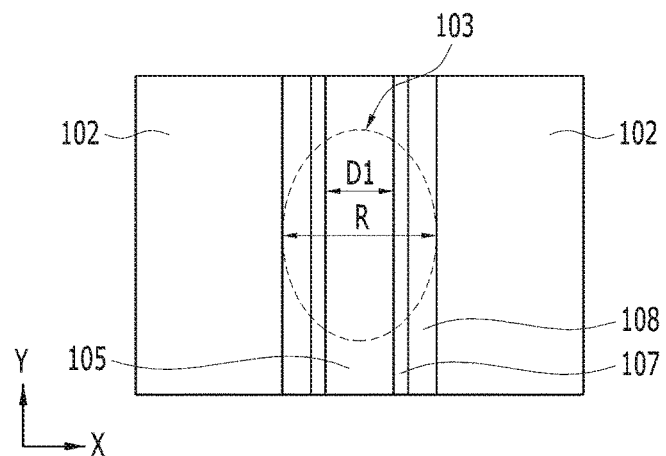
FIG. 2A is a plan view of the semiconductor device taken along a line A-A' shown in FIG. 1.
Figure 2B:
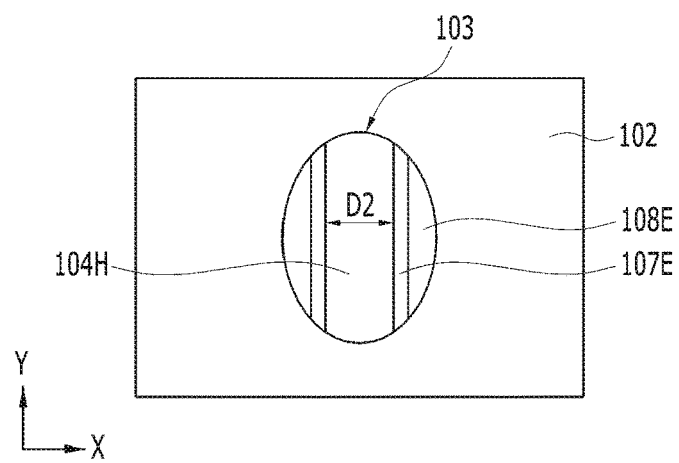
FIG. 2B is a plan view of the semiconductor device taken along a line B-B' shown in FIG. 1.
Figure 2C:
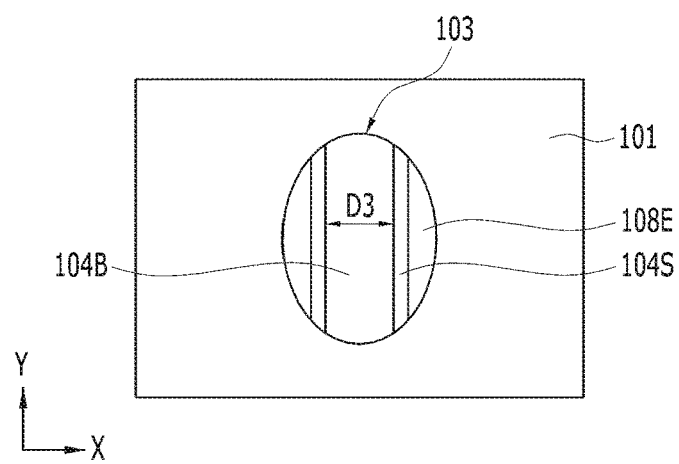
FIG. 2C is a plan view of the semiconductor device taken along a line C-C' shown in FIG. 1.

FIG. 1 is a cross-sectional view illustrating a semiconductor device, in accordance with an embodiment of the present invention. FIG. 2A is a plan view of the semiconductor device taken along a line A-A' shown in FIG. 1. FIG. 2B is a plan view of the semiconductor device taken along a line B-B' shown in FIG. 1. FIG. 2C is a plan view of the semiconductor device taken along a line C-C' shown in FIG. 1.

Referring to FIGS. 1 to 2C, the semiconductor device 100 may include a substrate structure 101, a contact plug 104, and a conductive line 105.

The substrate structure 101 may include an impurity region 101D. The substrate structure 101 may include a material that is appropriate for semiconductor processing. The substrate structure 101 may include a semiconductor substrate. The semiconductor substrate may be formed of a silicon-containing material. The semiconductor substrate may include one selected from a group including silicon, monocrystalline silicon, polysilicon, amorphous silicon, a silicon germanium, a monocrystalline silicon germanium, a polycrystalline silicon germanium, a carbon-doped silicon, or a combination thereof. The semiconductor substrate may be formed in a single layer or a multi-layer. The semiconductor substrate may include another semiconductor material, such as germanium. The semiconductor substrate may include a semiconductor substrate of a III/V-group material, e.g., a compound such as gallium arsenide (GaAs). The semiconductor substrate may include a Silicon-On-Insulator (SOI) substrate.

In the illustrated embodiment of the present invention of FIG. 1, the substrate structure 101 includes a semiconductor substrate 101A capped with an insulating material 101B. The insulating material may be, for example, a silicon oxide, a silicon nitride, or a combination thereof.

An insulating layer 102 may be formed over the substrate structure 101. The insulating layer 102 may be made of any suitable insulating material including, for example, an oxide, such as a silicon oxide. A contact hole 103 may be formed to penetrate through the insulating layer 102 and extend into an upper portion of the substrate structure 101 to expose the upper surface of the impurity region 101D which is positioned vertically below the contact hole 103. The contact hole 103 has a side wall having a sloped profile. It is noted however, that the side wall of the contact hole may also be formed with a vertical profile. From the perspective of a top view, the contact hole 103 has an oval shape with two horizontal axes of symmetry one in the Y direction and one in the X direction. (FIGS. 2B and 2C). However, the contact hole may also be formed to have a circular or substantially circular shape or an oval shape with only one axis of symmetry either in the X or the Y direction. According to another embodiment of the present invention, the contact hole 103 may have a rectangular or square shape. The contact hole 103 may have a generally high aspect ratio. The aspect ratio of the contact hole 103 is the ratio of the height of the contact hole 103 in the vertical direction over the width of the contact hole 103 in the horizontal direction.

A contact plug 104 may be formed inside the contact hole 103. The contact plug 104 may be electrically connected to the impurity region 101D. A conductive line 105 may be formed over the contact plug 104. A hard mask layer 106 may be formed over the conductive line 105. From the perspective of a top view, the conductive line 105 and the hard mask layer 106 may have a linear shape extending in the first direction Y. The conductive line 105 may have a first critical dimension D1 defined as a line width that is extended in the second direction X. The conductive line 105 may have a smaller critical dimension than a width R (also referred to as a radius R) of the contact hole 103 in the X direction. Hence, the radius R of the contact hole 103 as the term is used herein refers to the line width in the second direction X.

The conductive line 105 may be formed of a metal or metal-containing material. The conductive line 105 may be made, for example, of a metal, a metal nitride, a metal silicide, or a combination thereof. In various embodiments, the conductive line 105 may be made of tungsten nitride (WN), molybdenum nitride (MoN), titanium nitride (TIN), tantalum nitride (TaN), titanium silicon nitride (TiSiN), tantalum silicon nitride (TaSiN), tungsten (W), or a combination thereof. For example, the conductive line 105 may have a homogeneous or a heterogeneous structure. For example, the conductive line 105 may have a stacked structure with two- or more layers made from the aforementioned materials. In an embodiment, the conductive line 105 may have a two-layer stacked structure with a titanium nitride and a tungsten layer stacked wherein the titanium nitride layer is contacting the contact plug 104. The hard mask layer 106 may be formed of an insulating material having an etch selectivity with respect to the conductive line 105 and the contact plug 104. The hard mask layer 106 may be formed, for example, of a silicon oxide, a silicon nitride, or a combination thereof.

The contact plug 104 may be made of a silicon-containing material. The contact plug 104 may include a polysilicon, a doped polysilicon, an epitaxial silicon, or a doped epitaxial silicon. For example, the contact plug 104 may include a phosphorus (P)-doped polysilicon (SiP) or a SEG (Selectively Epitaxial Growth)-SiP.

The contact plug 104 may include a plug body 104B and a plug head 104H. The plug body 104B may contact the impurity region 101D, and the plug head 104H may contact the conductive line 105. The plug head 104H may have a second critical dimension D2. The plug body 104B may have a third critical dimension D3. The plug body 104B and the plug head 104H may have the same critical dimension. The plug head 104H and the conductive line 105 may have the same critical dimension. According to another embodiment of the present invention, the plug body 104B may have a smaller critical dimension than the plug head 104H and the conductive line 105. The plug body 104B and the plug head 104H may have a smaller critical dimension than the radius R of the contact hole 103. The upper surface of the contact plug 104 and the upper surface of the insulating layer 102 may be at the same level.

A first spacer element 109 may be formed on both side walls of the conductive line 105 and the hard mask layer 106. The first spacer element 109 may have a linear shape extending parallel to the side walls of the conductive line 105 and the hard mask layer 106 along the first direction Y.

A second spacer element 110 may be formed on both side walls of the contact plug 104. The contact hole 103 may be filled with the contact plug 104 and the second spacer element 110. A gap G may be defined on both sides of the contact plug 104. For example, the contact plug 104 may be positioned at the center of the contact hole 103, and a pair of gaps G may be defined on both side walls of the contact plug 104. The second spacer element 110 may be formed in the inside of the gaps G.

The first spacer element 109 may include a first spacer 107 and a third spacer 108. The first spacer 107 may cover the side walls of the conductive line 105 and the hard mask layer 106. The third spacer 108 may cover the side walls of the first spacer 107. The upper surfaces of the first spacer 107, the third spacer 108, and the hard mask layer 106 may be at the same level. The first spacer 107 may be thinner than the third spacer 108.

The first spacer 107 and the third spacer 108 may be formed of the same material or different materials. For example, the first spacer 107 and the third spacer 108 may be made of nitride. The first spacer element 109 may have an N-N (Nitride-Nitride) structure. The first spacer 107 and the third spacer 108 may be formed of a silicon nitride. The first spacer element 109 may have a $Si_3N_4$—$Si_3N_4$ structure.

The second spacer element 110 may include a first spacer extended portion 107E, a third spacer extended portion 108E, and a second spacer 104S. The first spacer extended portion 107E may be extended from the first spacer 107. The third spacer extended portion 108E may be extended from the third spacer 108. The second spacer 104S may cover the side wall of the plug body 104B. The first spacer extended portion 107E and the second spacer 104S may contact each other at a level that is lower than the top surface of the insulating layer 102. The first spacer extended portion 107E may cover the side wall of the plug head 104H. The third spacer extended portion 108E may cover the first spacer extended portion 107E and the second spacer 104S. The third spacer extended portion 108E may fill most of the gaps G. The third spacer extended portion 108E may be thicker than the first spacer extended portion 107E and the second spacer 104S. The third spacer extended portion 108E may be thicker than the third spacer 108.

The first spacer extended portion 107E and the third spacer extended portion 108E may be formed of the same material. The first spacer extended portion 107E and the third spacer extended portion 108E may be formed of a nitride. The second spacer 104S may be formed of a material that is different from the materials of the first spacer extended portion 107E and the third spacer extended portion 108E. For example, the second spacer 104S may be formed of an oxide. The second spacer element 110 may have an O—N—N (Oxide-Nitride-Nitride) structure. The first spacer extended portion 107E and the third spacer extended portion 108E may be formed of a silicon nitride, while the second spacer 104S may be formed of a silicon oxide. In an embodiment, the second spacer element 110 may have a $SiO_2$—$Si_3N_4$—$Si_3N_4$ structure.

The second spacer 104S may be formed by selectively oxidizing the side wall of the plug body 104B. The first spacer 107, the third spacer 108, the first spacer extended portion 107E, and the third spacer extended portion 108E may be formed by a Chemical Vapor Deposition (CVD) process or an Atomic Layer Deposition (ALD) process. As described above, the second spacer 104S may be formed by a selective oxidation process, and the first spacer 107, the third spacer 108, the first spacer extended portion 107E, and the third spacer extended portion 108E may be formed by a deposition process.

As described above, the first spacer extended portion 107E extends from the first spacer 107 and may cover both side walls of the plug head 104H. Therefore, an interface I1 between the conductive line 105 and the contact plug 104 may be protected by the first spacer extended portion 107E. The interface I1 may be substantially at the same level as the top surface of the insulating layer 102.

Also, since the second spacer 104S is formed by a selective oxidation of the plug body 104B, the performance of the third spacer extended portion 108E filling the gaps G may be improved.

Figure 3A:
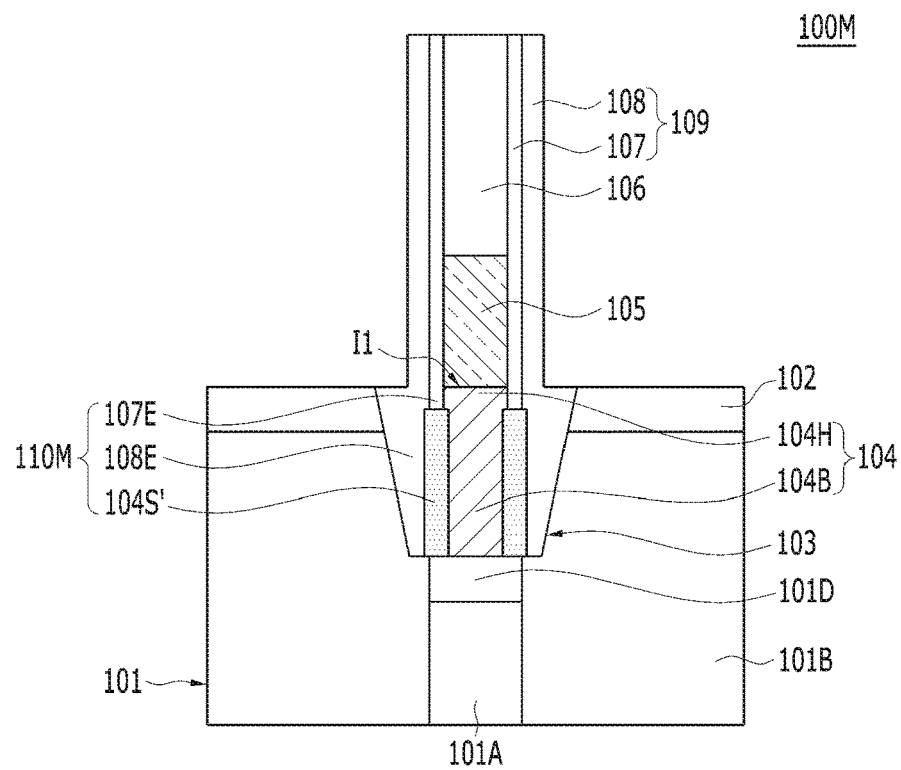
FIG. 3A is a cross-sectional view illustrating a first modified example of the semiconductor device in accordance with the embodiment of the present invention.

FIG. 3A is a cross-sectional view illustrating a first modified example of the semiconductor device in accordance with the first embodiment of the present invention. The constituent elements of the semiconductor device 100M may be the same as the semiconductor device 100 shown in FIG. 1, except that a second spacer element 110M of the semiconductor device 100M is different from the second spacer element 110 of FIG. 1.

The second spacer element 110M may include a second spacer 104S', a first spacer extended portion 107E, and a third spacer extended portion 108E. The second spacer 104S' may be formed by selectively oxidizing a side wall of the plug body 104B. The second spacer 104S' may be thicker than the second spacer 104S of FIG. 1. The second spacer 104S' may be thicker than the first spacer extended portion 107E. For example, the thickness of the second spacer 104S' may be obtained by increasing the time for performing the selective oxidation.

Figure 3B:
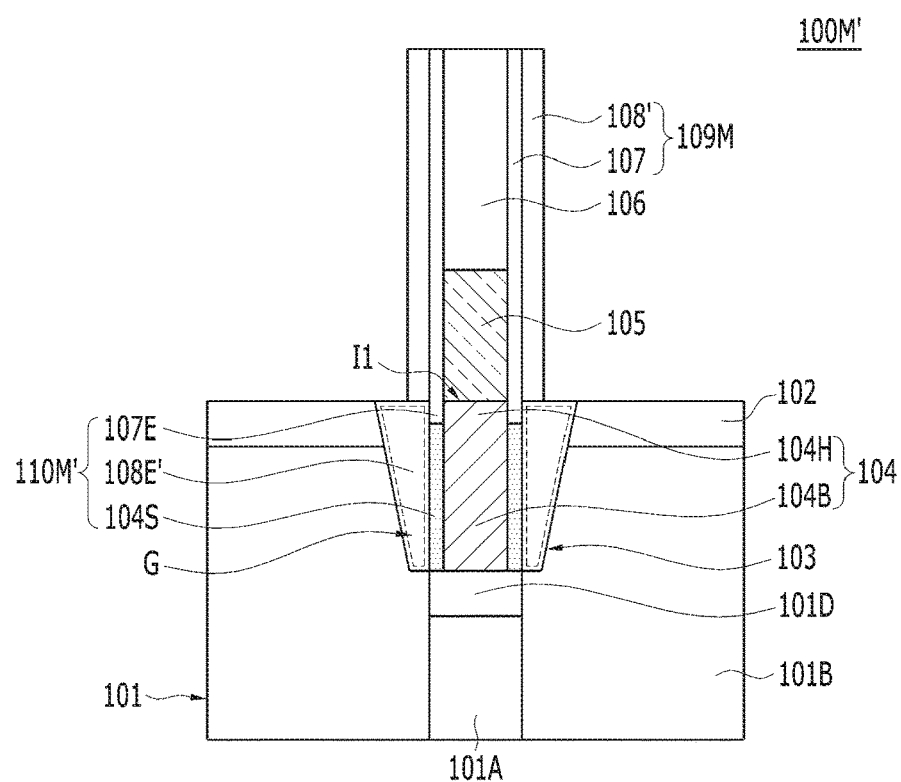
FIG. 3B is a cross-sectional view illustrating a second modified example of the semiconductor device in accordance with the embodiment of the present invention.

FIG. 3B is a cross-sectional view illustrating a second modified example of the semiconductor device in accordance with the first embodiment of the present invention.

Referring to FIG. 3B, the constituent elements of the semiconductor device 100M' may be the same as the semiconductor device 100 shown in FIG. 1, except that a first spacer element 109M and a second spacer element 110M' of the semiconductor device 100M' may be different from the first spacer element 109 and the second spacer element 110 of FIG. 1.

The second spacer element 110M' may include a second spacer 104S, a first spacer extended portion 107E, and a filling spacer 108E'. The filling spacer 108E' may fill the gaps G.

The first spacer element 109M may include a first spacer 107 and a third spacer 108'. The third spacer 108' and the filling spacer 108E' may be discontinuous. In other words, the third spacer 108' and the filling spacer 108E' may be formed by different formation processes. The third spacer 108' and the filling spacer 108E' may be formed of the same material or different materials.

FIGS. 4A to 4M are cross-sectional views illustrating a method for fabricating the semiconductor device in accordance with the first embodiment of the present invention.

Figure 4A:
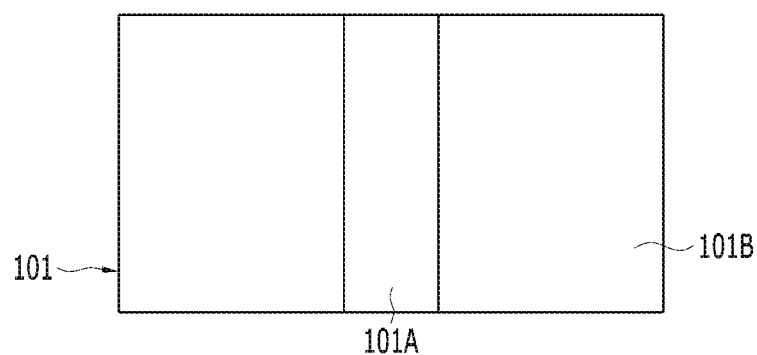
FIGS. 4A to 4M are cross-sectional views illustrating a method for fabricating the semiconductor device in accordance with the embodiment of the present invention.

Referring to FIG. 4A, a substrate structure 101 may be formed. The substrate structure 101 may be formed of a material that is appropriate for semiconductor processing. The substrate structure 101 may include a semiconductor substrate. The semiconductor substrate may be formed of a silicon-containing material. The semiconductor substrate may be formed of any suitable material including one selected from a group including silicon, monocrystalline silicon, polysilicon, amorphous silicon, a silicon germanium, a monocrystalline silicon germanium, a polycrystalline silicon germanium, a carbon-doped silicon, a combination thereof, or a multi-layer of two or more of them. The semiconductor substrate may be formed of another semiconductor material, such as germanium. The semiconductor substrate may include a semiconductor substrate of a III/V-group material, e.g., a compound such as gallium arsenide (GaAs). The semiconductor substrate may include a Silicon-On-Insulator (SOI) substrate.

In this embodiment of the present invention, the substrate structure 101 may include a semiconductor substrate capped with an insulating material. For example, the insulating material may be formed of a suitable material including a silicon oxide, a silicon nitride, or a combination thereof. The substrate structure 101 may also be referred to as 'a dielectric-capped semiconductor substrate'. The substrate structure 101 may include a semiconductor substrate 101A and an insulating material 101B.

Figure 4B:
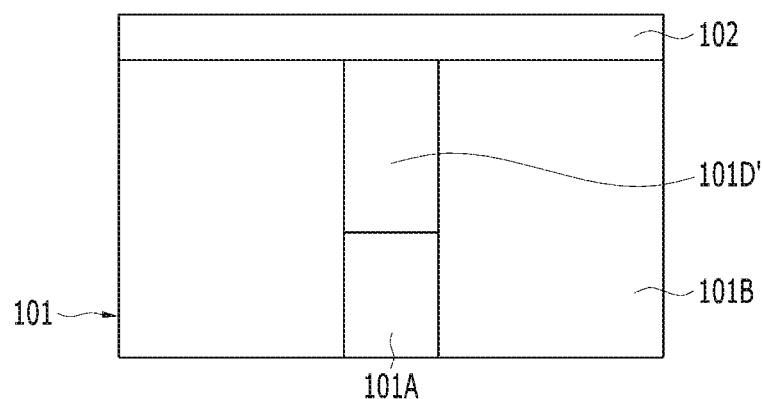

Referring to FIG. 4B, the impurity region 101D' may be formed in the inside of the substrate structure 101. The impurity region 101D' may be formed in the semiconductor substrate 101A of the substrate structure 101. The impurity region 101D' may be formed by a doping process such as an ion implantation process. The impurity region 101D' may be doped with an N-type dopant or a P-type dopant. The impurity region 101D' may become a source or a drain region of a transistor.

Subsequently, the insulating layer 102 may be formed over the substrate structure 101. The insulating layer 102 may be formed of a material having an etch selectivity with respect to the substrate structure 101. The insulating layer 102 may be formed of a suitable material including a silicon oxide. For example, the insulating layer 102 may include TEOS (Tetra-Ethyl-Ortho-Silicate).

Figure 4C:
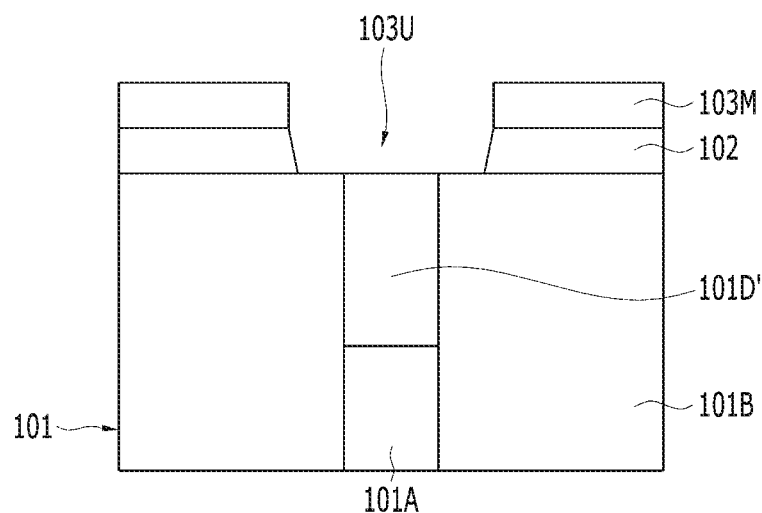

Referring to FIG. 4C, an upper contact hole 103U may be formed. To form the upper contact hole 103U, the insulating layer 102 may be etched using a contact mask 103M. From the perspective of a plan view, the upper contact hole 103U may have a circular shape or an oval shape. The upper contact hole 103U may expose a portion of the substrate structure 101. The upper contact hole 103U may have a radius that is controlled to a predetermined line width. The upper contact hole 103U may expose the impurity region 101D'.

Figure 4D:
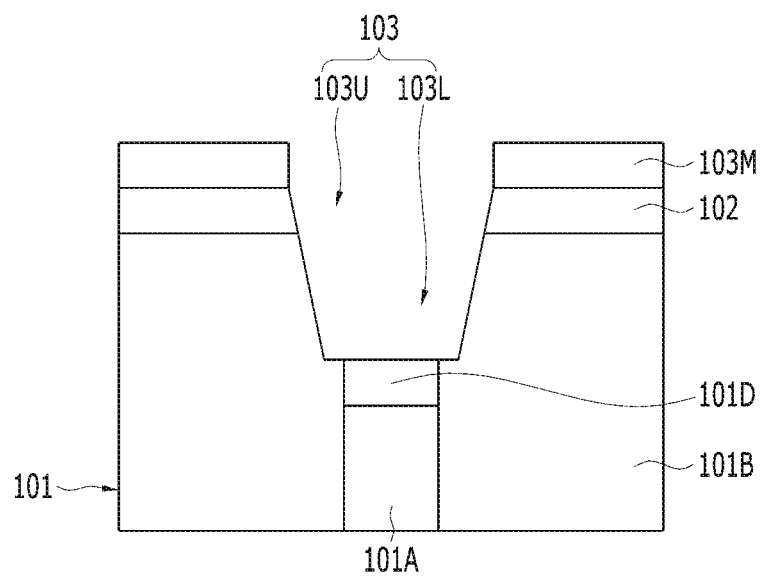

Referring to FIG. 4D, the upper contact hole 103U may be extended into the inside of the substrate structure 101. For example, the impurity region 101D' and the insulating material 101B below the upper contact hole 103U may be recessed to a predetermined depth by etching to form a lower contact hole 103L.

The lower contact hole 103L and the upper contact hole 103U form the contact hole 103. The remaining impurity region 101D may be disposed below the bottom surface of the contact hole 103. The bottom surface of the contact hole 103 may be disposed lower than the upper surface of the substrate structure 101. The height or thickness of the remaining impurity region 101D may vary by design choice.

Figure 4E:
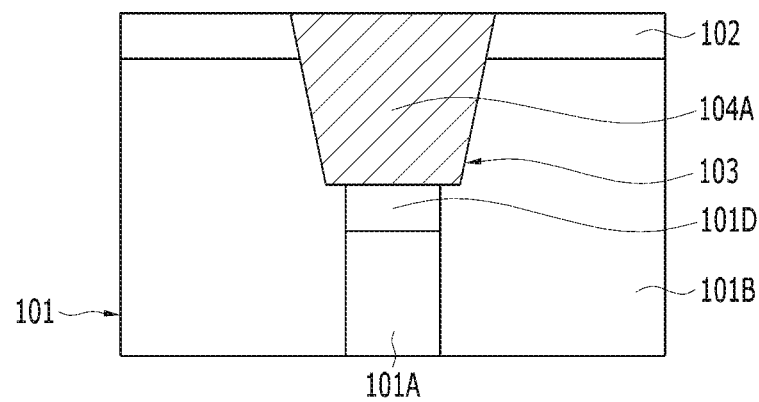

Referring to FIG. 4E, the contact mask 103M may be removed and then a first conductive layer 104A may be formed in the inside of the contact hole 103. The first conductive layer 104A may be formed by forming a conductive material (not shown) to fill the contact hole 103 and planarizing the conductive material through an etch-back process or a Chemical Mechanical Polishing (CMP) process.

The first conductive layer 104A may be formed of a metal, a metal-containing material or a silicon-containing material. The first conductive layer 104A may be formed of polysilicon.

According to an embodiment of the present invention, the first conductive layer 104A may be formed through a Selectively Epitaxial Growth (SEG) method. For example, the first conductive layer 104A may include a SEG-SiP. The first conductive layer 104A may be formed through the SEG without voids.

After planarization, the upper surface of the first conductive layer 104A and the upper surface of the insulating layer 102 may be disposed at the same level.

Figure 4F:
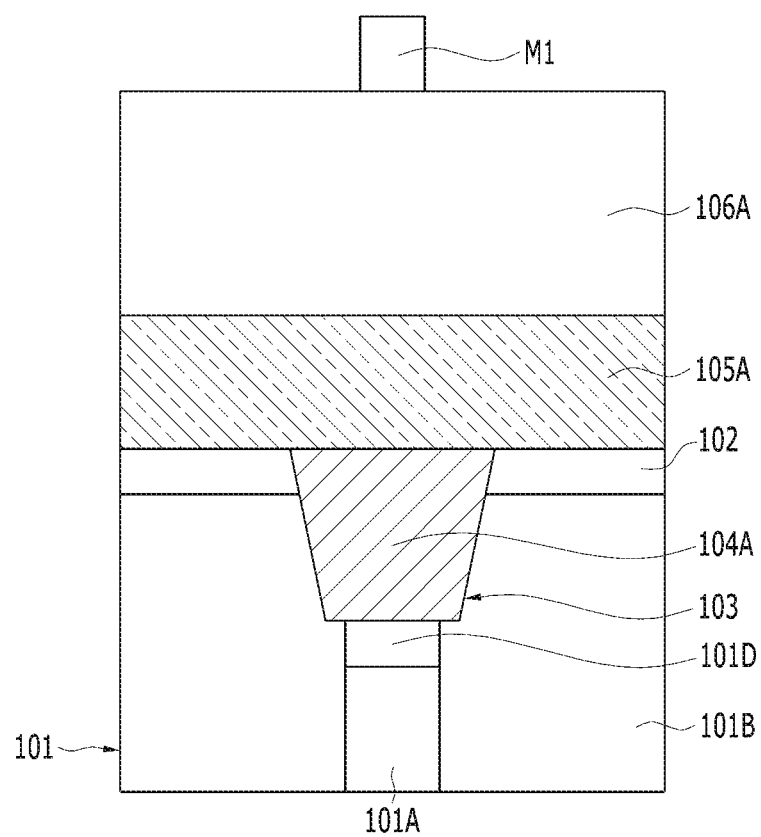

Referring to FIG. 4F, a second conductive layer 105A and a hard mask material layer 106A may be stacked over the structure of FIG. 4E. The second conductive layer 105A and the hard mask material layer 106A may be sequentially stacked over the top surface of the first conductive layer 104A and the top surface of the insulating layer 102. The second conductive layer 105A may be formed of a metal or a metal-containing material. The second conductive layer 105A may be formed a metal, a metal nitride, a metal silicide, or a combination thereof. The second conductive layer 105A may be formed of a tungsten nitride (WN), a molybdenum nitride (MoN), a titanium nitride (TiN), a tantalum nitride (TaN), a titanium silicon nitride (TiSiN), a tantalum silicon nitride (TaSiN), tungsten (W), or a combination thereof. The hard mask material layer 106A may be formed of an insulating material having an etch selectivity with respect to the first conductive layer 104A and the second conductive layer 105A. The hard mask material layer 106A may be formed of a suitable material including a silicon oxide, a silicon nitride, or a combination thereof. The hard mask material layer 106A may also be referred to as a capping layer.

A mask layer M1 may be formed over the hard mask material layer 106A. The mask layer M1 may include a photoresist pattern. The mask layer M1 may be formed through a patterning process, such as Spacer Patterning Technology (SPT) or Double Patterning Technology (DPT).

Figure 4G:
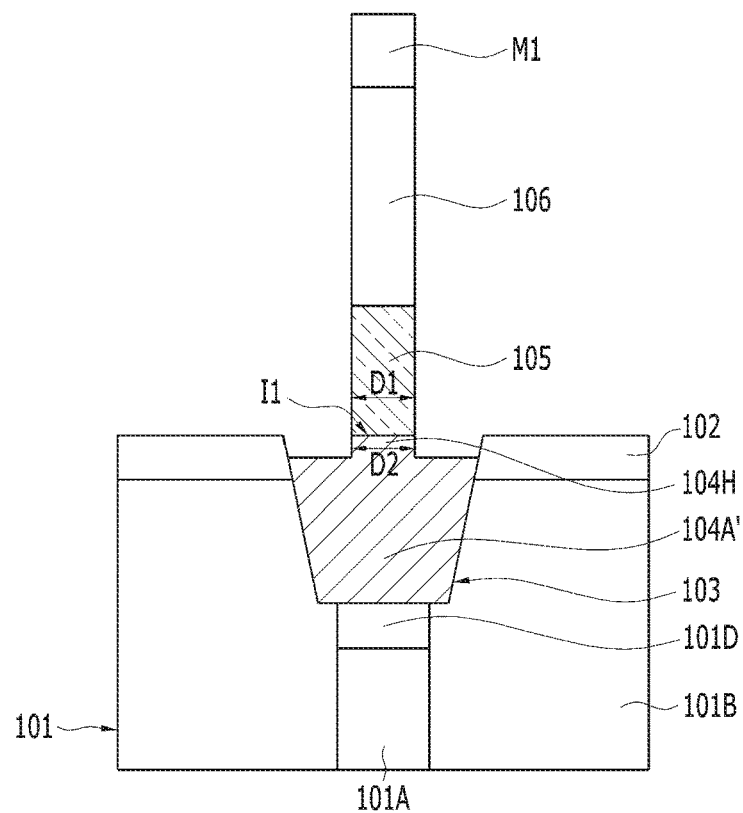

Referring to FIG. 4G, the conductive line 105 and the hard mask layer 106 may be formed. The hard mask material layer 106A and the second conductive layer 105A may be sequentially etched by using the mask layer M1 as an etch barrier to form the conductive line 105 and the hard mask layer 106. The conductive line 105 may be formed by etching the second conductive layer 105A. The hard mask layer 106 may be formed by etching the hard mask material layer 106A. The etch process for forming the conductive line 105 may include a dry etch process. The dry etch process may include an anisotropic etch process.

The conductive line 105 and the hard mask layer 106 may have the first critical dimension D1.

Subsequently, the first conductive layer 104A under the conductive line 105 may be partially etched. The first conductive layer 104A may be partially etched by using the mask layer M1 as an etch barrier. As a result, the plug head 104H may be formed under the conductive line 105. The plug head 104H may have a second critical dimension D2. The plug head 104H and the conductive line 105 may have the same critical dimension. The first critical dimension D1 and the second critical dimension D2 may be the same.

The first conductive layer may remain below the plug head 104H as 'a remaining first conductive layer 104A''. The upper surface of the remaining first conductive layer 104A' may have a recessed surface that is lower than the upper surface of the insulating layer 102.

A contact interface I1 may be formed between the plug head 104H and the conductive line 105. The contact interface I1 may be substantially at the same level as the top surface of the insulating layer 102.

Figure 4H:
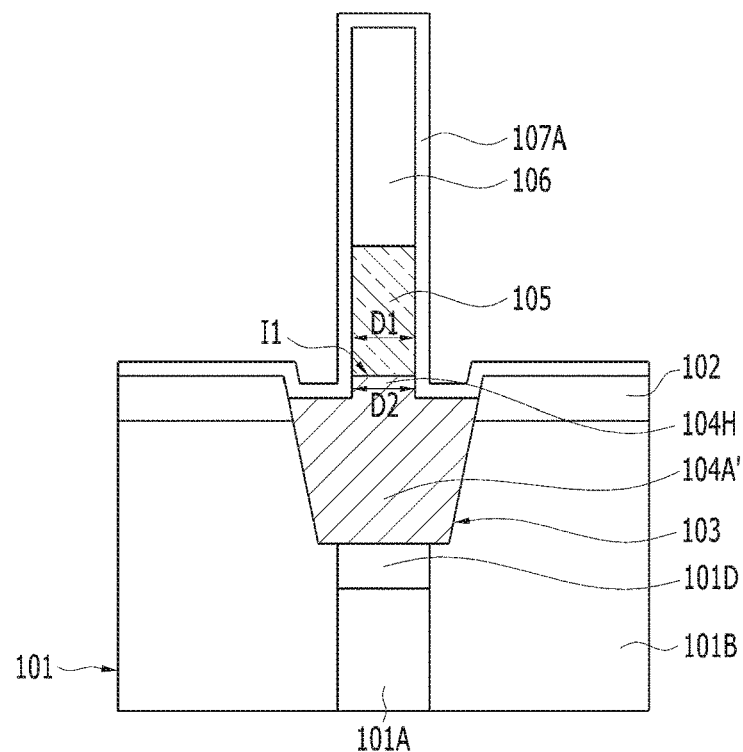

Referring to FIG. 4H, a first spacer layer 107A may be formed on both side walls of the conductive line 105. Before the first spacer layer 107A is formed, the mask layer M1 may be removed.

The first spacer layer 107A may cover both side walls of the plug head 104H. The first spacer layer 107A may cover the upper surface of the remaining first conductive layer 104A'.

To form the first spacer layer 107A, an insulating material may be deposited over the conductive line 105 and the hard mask layer 106. The first spacer layer 107A may include a material having an etch selectivity with respect to the remaining first conductive layer 104A'. For example, the first spacer layer 107A may include a silicon nitride.

Figure 4I:
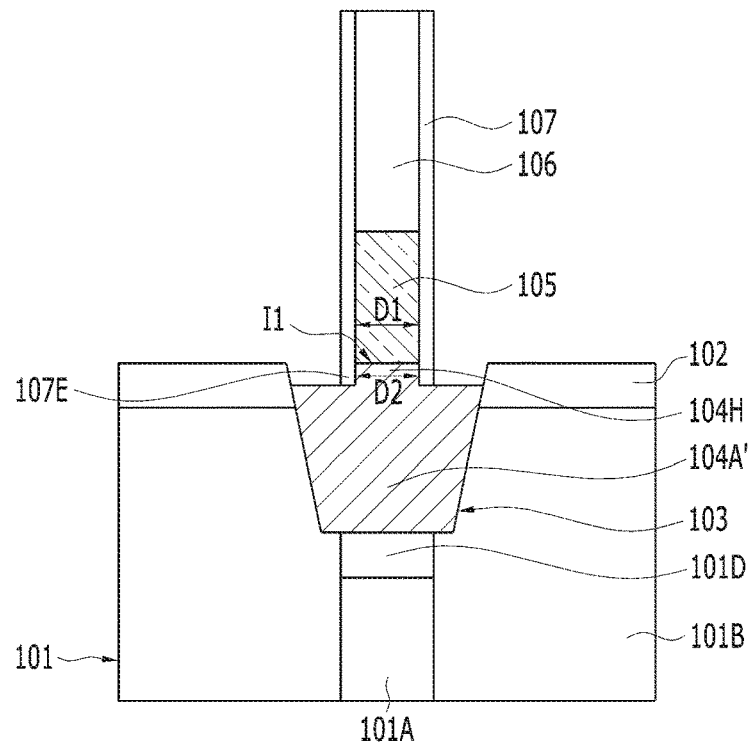

Referring to FIG. 4I, the first spacer 107 may be formed. The first spacer 107 may be formed by selectively removing the first spacer layer 107A from the upper surface of the insulating layer 102, the upper surface of the remaining first conductive layer 104A', and the upper surface of the hard mask layer 106, through the etching process. As a result, the first spacer 107 may be formed covering both side walls of the conductive line 105 and the hard mask layer 106. The first spacer 107 may also extend to cover both side walls of the plug head 104H. The upper surface of the remaining first conductive layer 104A' may be exposed.

The first spacer 107 may be parallel to both side walls of the conductive line 105 and the hard mask layer 106. The bottom portion of the first spacer 107, i.e., the first spacer extended portion 107E, may cover both side walls of the plug head 104H. The first spacer extended portion 107E may cover both side walls of the contact interface I1 between the plug head 104H and the conductive line 105.

Figure 4J:
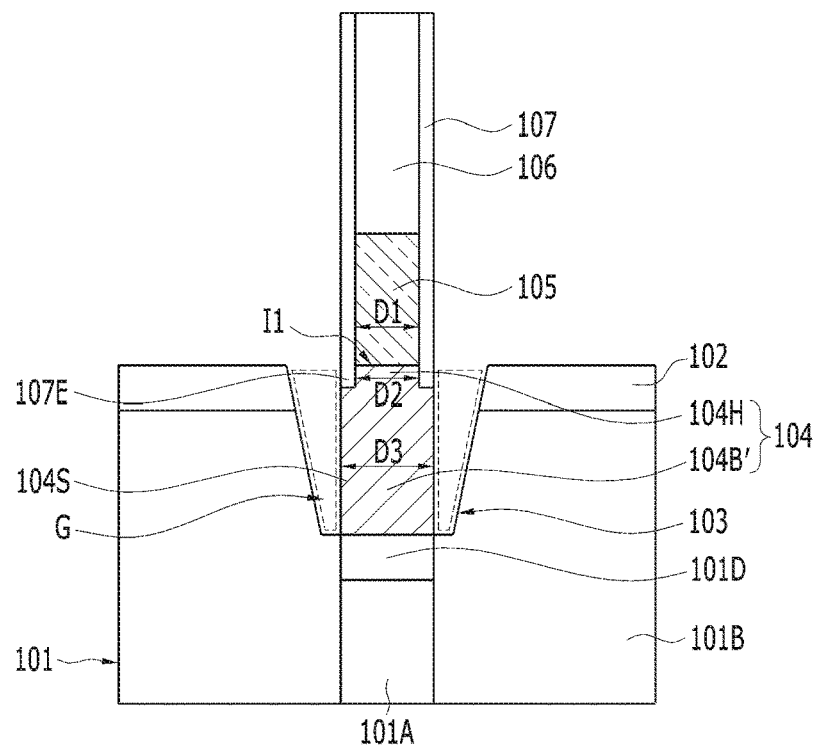

Referring to FIG. 4J, the remaining first conductive layer 104A' may be etched. For example, the remaining first conductive layer 104A' may be dry etched to expose the bottom surface of the contact hole 103. The remaining first conductive layer 104A' may be etched to be self-aligned with the outer side surface of the first spacer 107 to form a plug body 104B'.

The plug body 104B' may be formed over the impurity region 101D and the plug head 104H may be disposed over the plug body 104B'. The plug body 104B' and the plug head 104H may be disposed in the inside of the contact hole 103. The line width of the plug body 104B' may be shorter than the radius of the contact hole 103. Therefore, a gap G may be formed on both side walls of the plug body 104B'.

The gap G may be disposed in the inside of the contact hole 103. This is because the plug body 104B' is formed by being etched smaller than the radius of the contact hole 103. The gap G is not of a form surrounding the plug body 104B' but the gap G is independently formed on both side walls of the plug body 104B'. After all, one plug body 104B' and a pair of gaps G are disposed in the inside of the contact hole 103, and the pair of the gaps G may be separated by the plug body 104B'.

The plug body 104B' may have a third critical dimension D3. The third critical dimension D3 may be greater than the first critical dimension D1 and the second critical dimension D2. In other words, the plug body 104B' may have a greater critical dimension than the plug head 104H and the conductive line 105. As illustrated in FIG. 4J the critical dimension D3 may be greater than the critical dimension D1 by the width of the first spacer 107. The width of the first spacer 107 may vary by design.

The plug head 104H may contact the conductive line 105. The contact interface I1 between the plug head 104H and the conductive line 105 may be at the same level as the upper surface of the insulating layer 102.

Both side walls of the plug body 104B' may not be covered by the first spacer extended portion 107E. Both side walls of the plug head 104H may be covered by the first spacer extended portion 107E. Both side walls of the conductive line 105 and the hard mask layer 106 may be covered by the first spacer 107.

As described above, since both side walls of the conductive line 105 are covered by the first spacer 107, the conductive line 105 may be protected from etch attack during the process of etching the remaining first conductive layer 104A'. Also, the contact interface I1 between the plug head 104H and the conductive line 105 may be protected from the etch attack.

Figure 5:
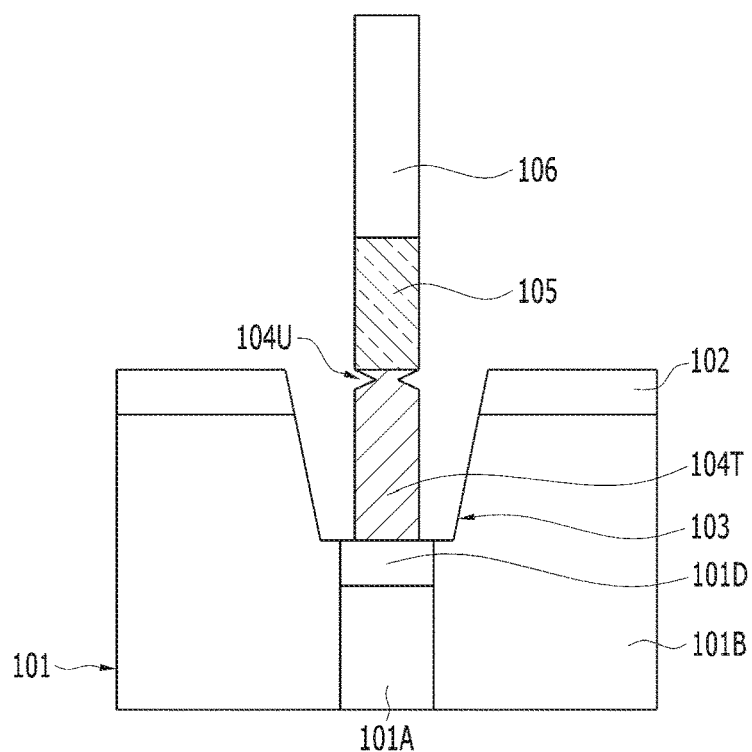
FIG. 5 is a cross-sectional view illustrating a method for fabricating a semiconductor device in accordance with a Comparative Example.

FIG. 5 is a cross-sectional view illustrating a method for fabricating a semiconductor device in accordance with a Comparative Example.

Referring to FIG. 5, if the second conductive layer 105A and the first conductive layer 104A are etched all at once without forming the first spacer 107. As a result, a contact plug 104T is formed. However, while the first conductive layer 104A is being etched, the conductive line 105 is attacked from the etch process. In particular, over-etch may occur on the contact interface between the conductive line 105 and the contact plug 104T. As a result, undercut 104U may be formed. The undercut 104U may deteriorate the electrical characteristics of the semiconductor device.

Differently from the comparative example, according to the embodiment of the present invention, it is possible to prevent the undercut from occurring in the contact interface I1 between the conductive line 105 and the plug head 104H during the process of etching the remaining first conductive layer 104A' by forming the first spacer 107 in advance.

Figure 4K:
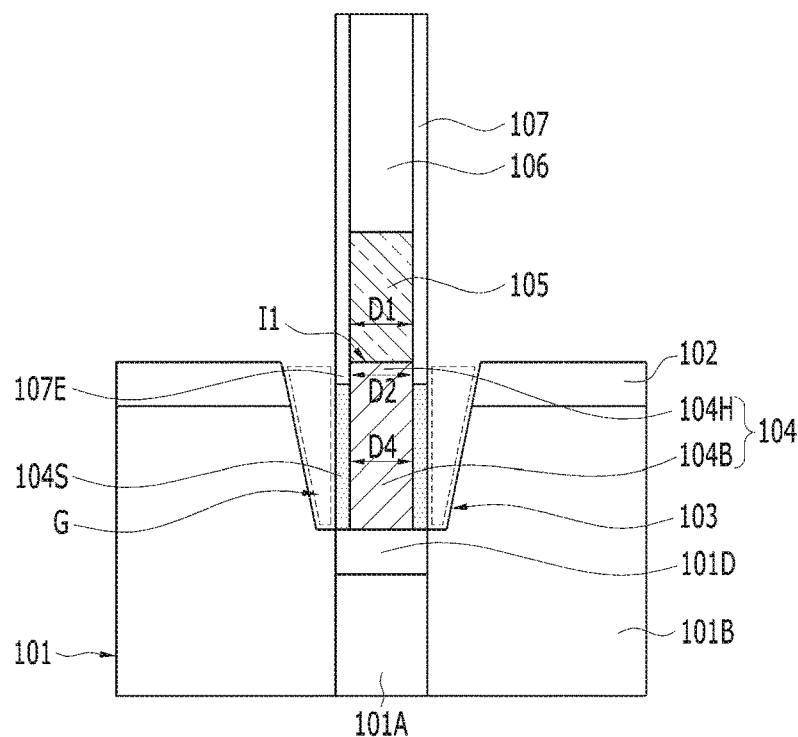

Referring to FIG. 4K, a second spacer 104S may be formed. The second spacer 104S may be formed on both side walls of the plug body 104B'. The second spacer 104S may be formed through an oxidation process. For example, the second spacer 104S may be formed by selectively oxidizing both side walls of the plug body 104B'. When the plug body 104B' includes polysilicon, the second spacer 104S may be of a silicon oxide.

During the oxidation process for forming the second spacer 104S, the first spacer 107 may protect both side walls of the conductive line 105. Therefore, it is possible to selectively oxidize both side walls of the plug body 104B' while suppressing the oxidation of the conductive line 105. The second spacer 104S may decrease the critical dimension of the plug body 104B'. In other words, the plug body may remain as a remaining plug body 104B, and the remaining plug body 104B may have a fourth critical dimension D4 which is decreased from the critical dimension of the plug body 104B'. The fourth critical dimension D4 may be the same as the second critical dimension D2 of the plug head 104H. According to another embodiment of the present invention, the fourth critical dimension D4 may be smaller than the second critical dimension D2.

The second spacer 104S may contact the lower portion of the first spacer 107, which is the first spacer extended portion 107E. Due to the presence of the first spacer extended portion 107E and the second spacer 104S, the plug head 104H and the remaining plug body 104B may be sealed up airtight from the outside.

Care should be exercised so that the second spacer 104S does not decrease the size of the gap G. When the oxidation process is excessive, the size of the gap G is excessively decreased, and the side wall of the remaining plug body 104B may be reduced excessively.

In an embodiment, the oxidation is controlled so that the second spacer 104S may have the same thickness as the first spacer extended portion 107E. According to another embodiment of the present invention, the second spacer 104S may be thicker than the first spacer extended portion 107E.

Figure 4L:
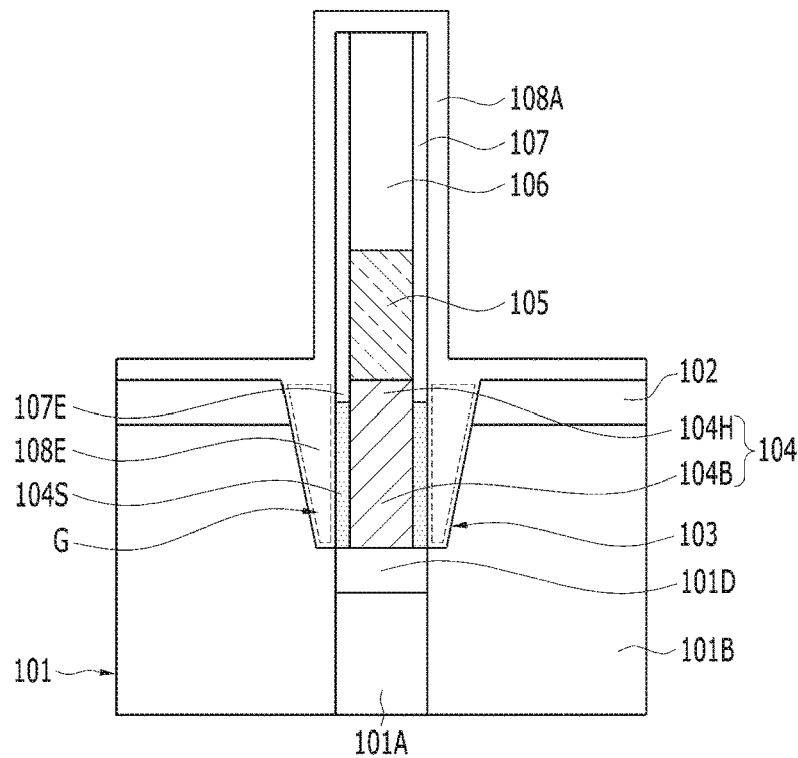
Figure 4M:
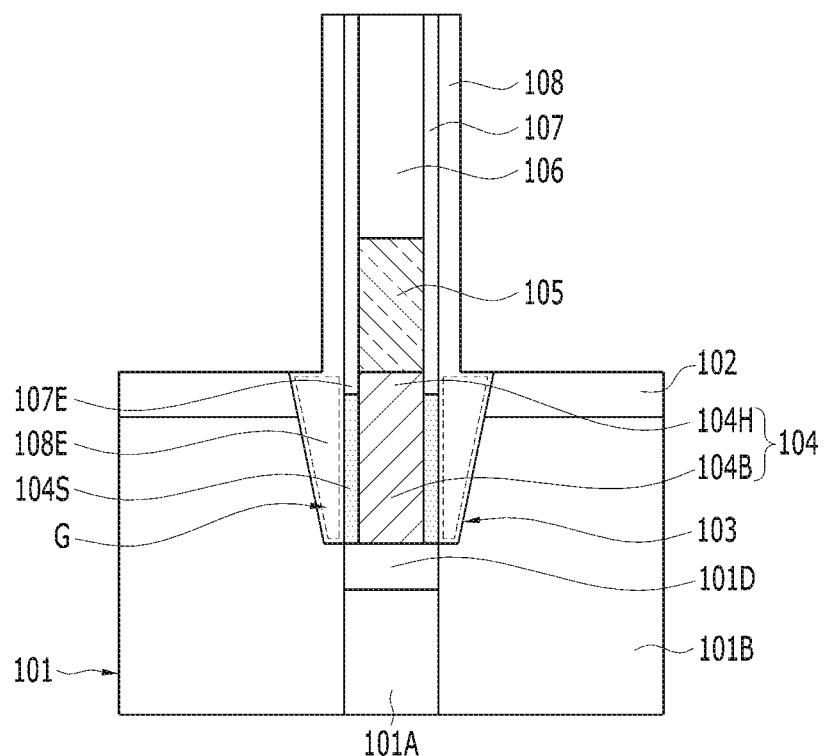

Referring to FIGS. 4L and 4M, the third spacer 108 may be formed. The third spacer 108 may be formed over the second spacer 104S. The third spacer 108 may fill the gap G. The third spacer 108 may be formed by depositing an insulating material and performing an etch-back process. For example, as illustrated in FIG. 4L, a third spacer layer 108A may be formed over the second spacer 104S and the first spacer 107. Subsequently, as shown in FIG. 4M, an etch-back process may be performed in such a manner that the third spacer layer 108A may remain in the inside of the gap G. The remaining third spacer layer may become the third spacer 108. The third spacer 108 may include a low dielectric material. The third spacer 108 may include a silicon nitride.

The third spacer 108 may be parallel to both side walls of the conductive line 105. The third spacer 108 may cover the first spacer 107. The bottom portion of the third spacer 108, i.e., the third spacer extended portion 108E, may fill the gap G. The third spacer extended portion 108E may cover the second spacer 104S and the first spacer extended portion 107E.

The contact hole 103 may be filled with the contact plug 104, the first spacer extended portion 107E, the second spacer 104S, and the third spacer extended portion 108E.

The first spacer extended portion 107E and the third spacer extended portion 108E may include a silicon nitride. The second spacer 104S may be formed of a suitable material including a silicon oxide. Therefore, an N—N (Nitride-Nitride) structure may be formed on the side wall of the plug head 104H, and an O—N (Oxide-Nitride) structure may be formed on the side wall of the remaining plug body 104B.

The first spacer 107 and the third spacer 108 may be formed on both side walls of the conductive line 105. The plug head 104H may be covered by the first spacer extended portion 107E, and the remaining plug body 104B may be covered by the second spacer 104S. The contact interface I1 between the plug head 104H and the conductive line 105 may be sealed up airtight by the first spacer extended portion 107E.

Figure 6:
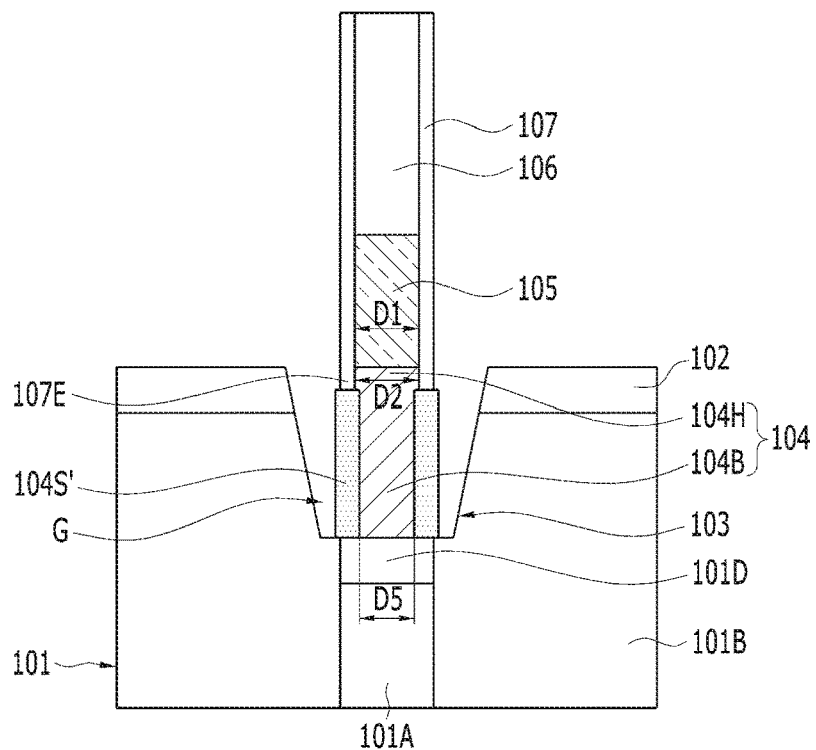
FIG. 6 is a cross-sectional view illustrating a method for fabricating the semiconductor device shown in FIG. 3A in accordance with the first modified example of the embodiment of the present invention.

FIG. 6 is a cross-sectional view illustrating a method for fabricating the semiconductor device 100M shown in FIG. 3A in accordance with the first modified example of the first embodiment of the present invention.

First of all, the substrate structure including up to the plug body 104B' may be formed through the method described above with reference to FIGS. 4A to 4J.

Subsequently, as illustrated in FIG. 6, a second spacer 104S' may be formed. The second spacer 104S' may be formed on both side walls of the plug body 104B'. The second spacer 104S' may be formed through an oxidation process. For example, the second spacer 104S' may be formed by selectively oxidizing both side walls of the plug body 104B'. When the plug body 104B' includes polysilicon, the second spacer 104S' may be of a silicon oxide.

During the oxidation process for forming the second spacer 104S', the first spacer 107 may protect both side walls of the conductive line 105. Therefore, it is possible to selectively oxidize both side walls of the plug body 104B' while suppressing the oxidation of the conductive line 105. The second spacer 104S' may decrease the critical dimension of the plug body 104B'. In other words, the plug body may remain as a remaining plug body 104B, and the remaining plug body 104B may have a fifth critical dimension D5 which is decreased from the critical dimension of the plug body 104B'. The fifth critical dimension D5 may be smaller than the second critical dimension D2 of the plug head 104H. Also, the fifth critical dimension D5 may be smaller than the fourth critical dimension D4 of FIG. 4K. The second spacer 104S' may be thicker than the second spacer 104S of FIG. 4K.

The second spacer 104S' may contact the lower portion of the first spacer 107, which is the first spacer extended portion 107E. Due to the presence of the first spacer extended portion 107E and the second spacer 104S, the plug head 104H and the remaining plug body 104B may be sealed up airtight from the outside.

The second spacer 104S' may be thicker than the first spacer extended portion 107E. The increased thickness of the second spacer 104S' may decrease the size of the gap G. Although the size of the gap G is decreased, little void may be formed when the third spacer 108 is formed subsequently.

FIGS. 7A to 7D are cross-sectional views illustrating a method for fabricating the semiconductor device 100M' shown in FIG. 3B in accordance with the second modified example of the first embodiment of the present invention.

First of all, the substrate structure including up to the remaining plug body 104B and the second spacer 104S may be formed through the method described above with reference to FIGS. 4A to 4K.

Figure 7A:
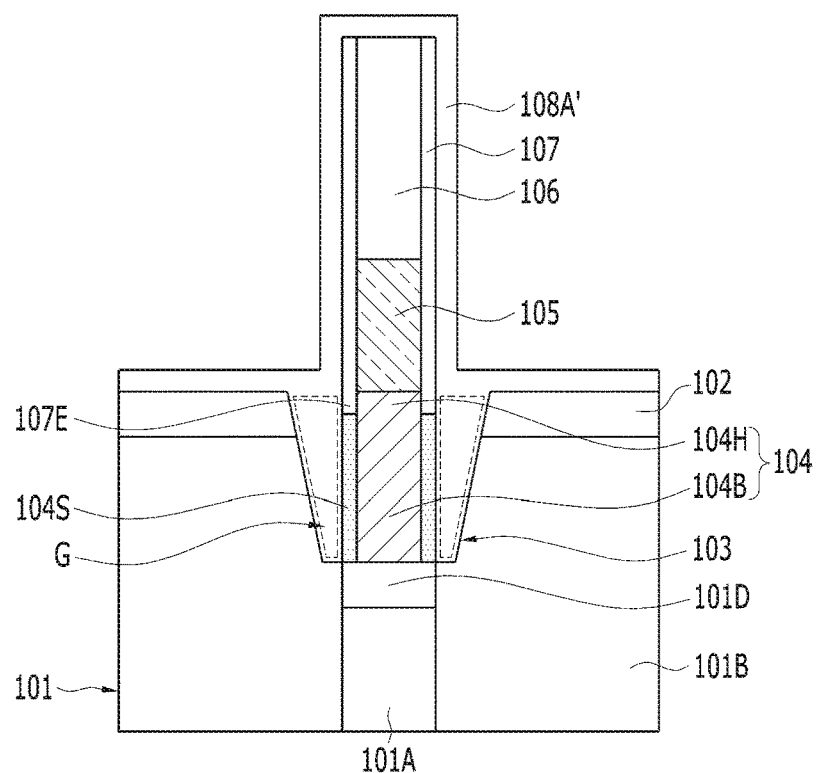
FIGS. 7A to 7D are cross-sectional views illustrating a method for fabricating the semiconductor device shown in FIG. 3B in accordance with the second modified example of the embodiment of the present invention.

Subsequently, as illustrated in FIG. 7A, a preliminary spacer layer 108A' may be formed over the second spacer 104S and the first spacer 107. The preliminary spacer layer 108A' may be thinner than the third spacer layer 108A. The preliminary spacer layer 108A' may fill the gap G.

Figure 7B:
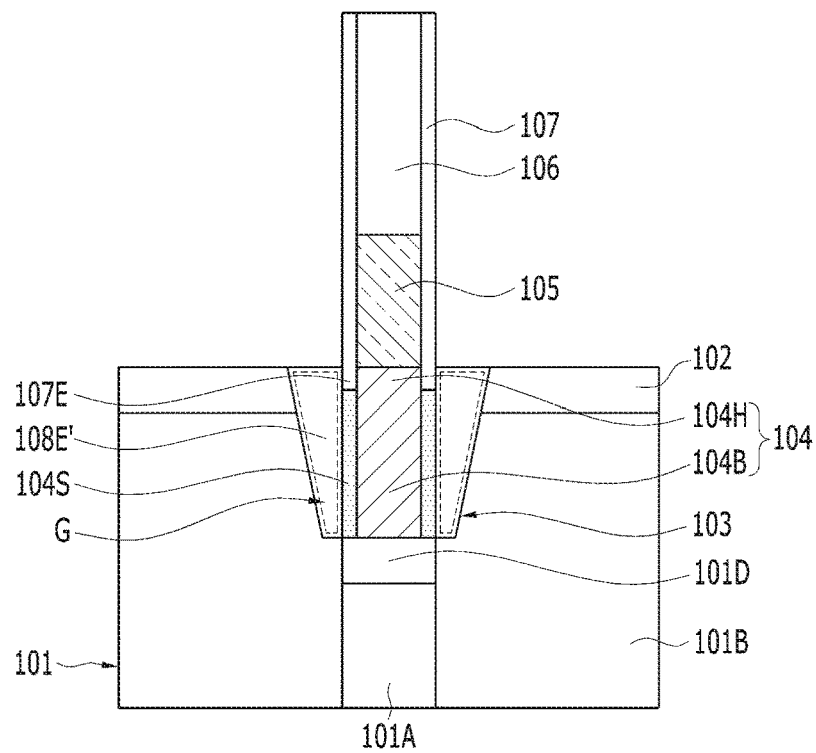

Referring to FIG. 7B, an etch-back process may be performed in such a manner that the filling spacer 108E' may remain in the inside of the gap G. The filling spacer 108E' may include a low dielectric material. The filling spacer 108E' may include a silicon nitride or a silicon oxide.

Figure 7C:
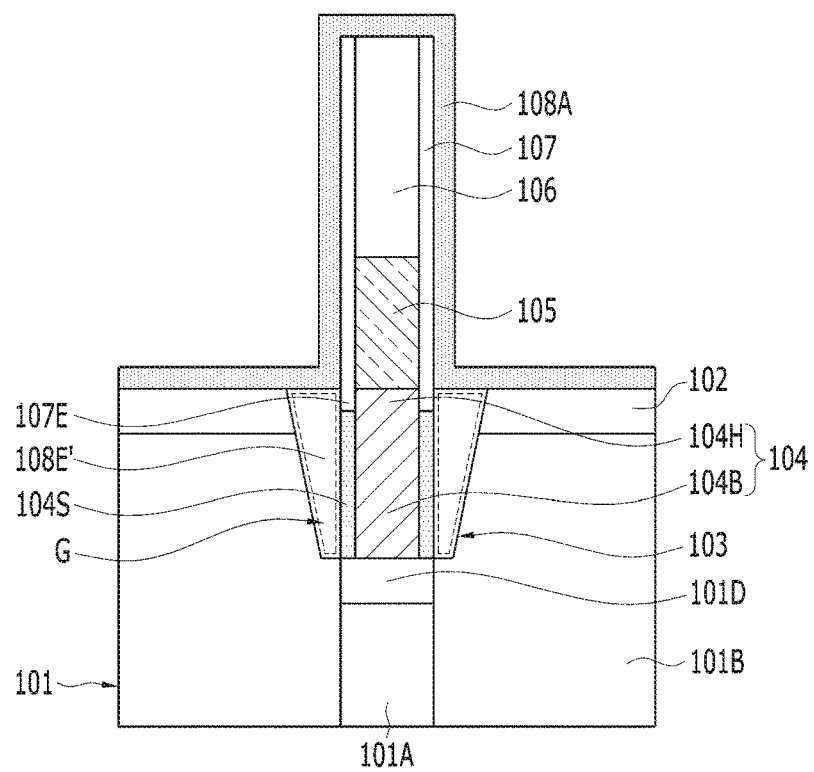

Referring to FIG. 7C, the third spacer layer 108A may be formed over the filling spacer 108E' and the first spacer 107. The third spacer layer 108A may not fill the gap G, which is different from the third spacer layer 108A of FIG. 4L. The third spacer layer 108A may cover the upper portion of the filling spacer 108E'.

Figure 7D:
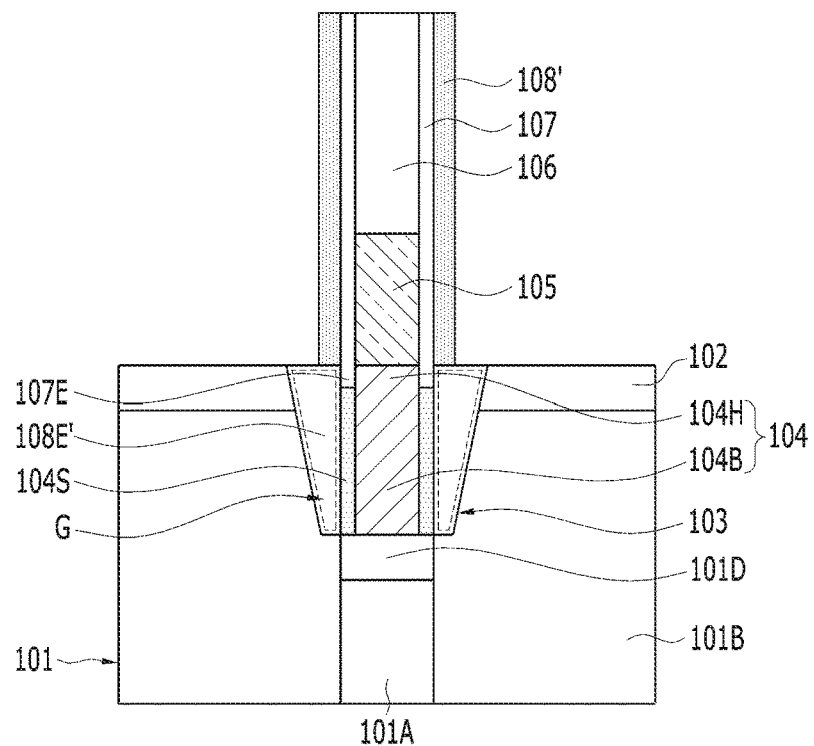

Referring to FIG. 7D, the third spacer 108' may be formed. The third spacer 108' may be formed by performing an etch-back process onto the third spacer layer 108A. The third spacer 108' may cover the first spacer 107. The third spacer 108' and the filling spacer 108E' may be discontinuous. The third spacer 108' may include a silicon nitride.

Figure 8A:
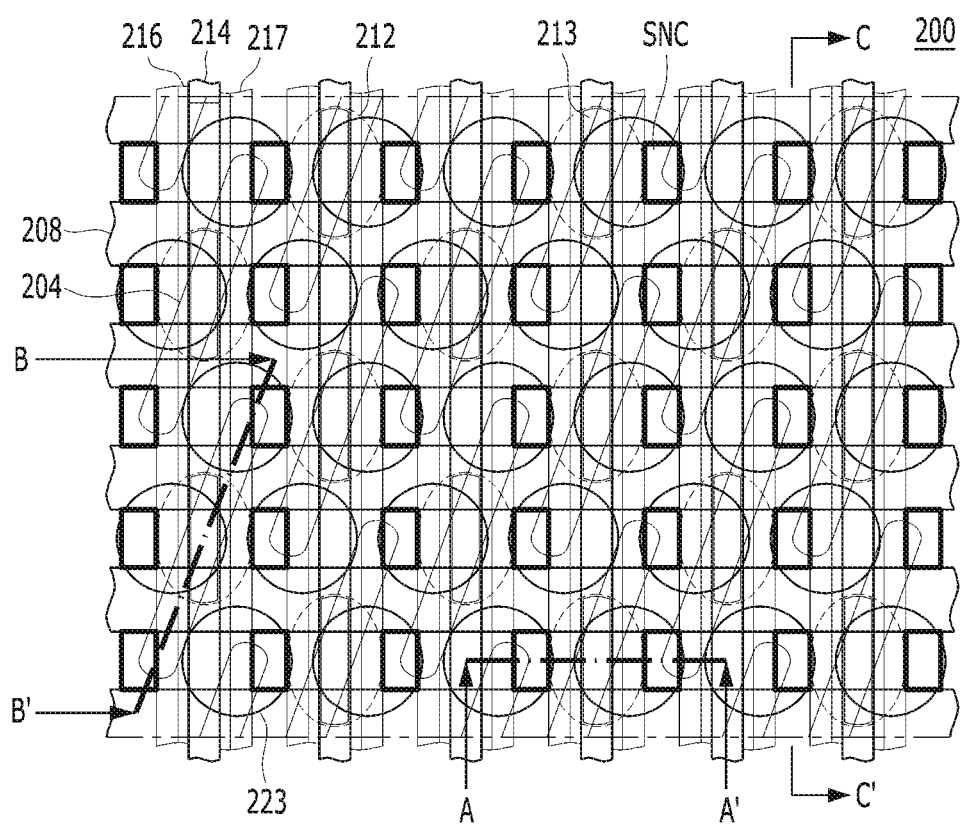
FIG. 8A is a plan view illustrating a semiconductor device in accordance with an embodiment of the present invention.

FIGS. 8A to 9 illustrate a semiconductor device in accordance with a second embodiment of the present invention. In the second embodiment of the present invention, a semiconductor device having memory cells, such as a DRAM device, is described.

Figure 8B:
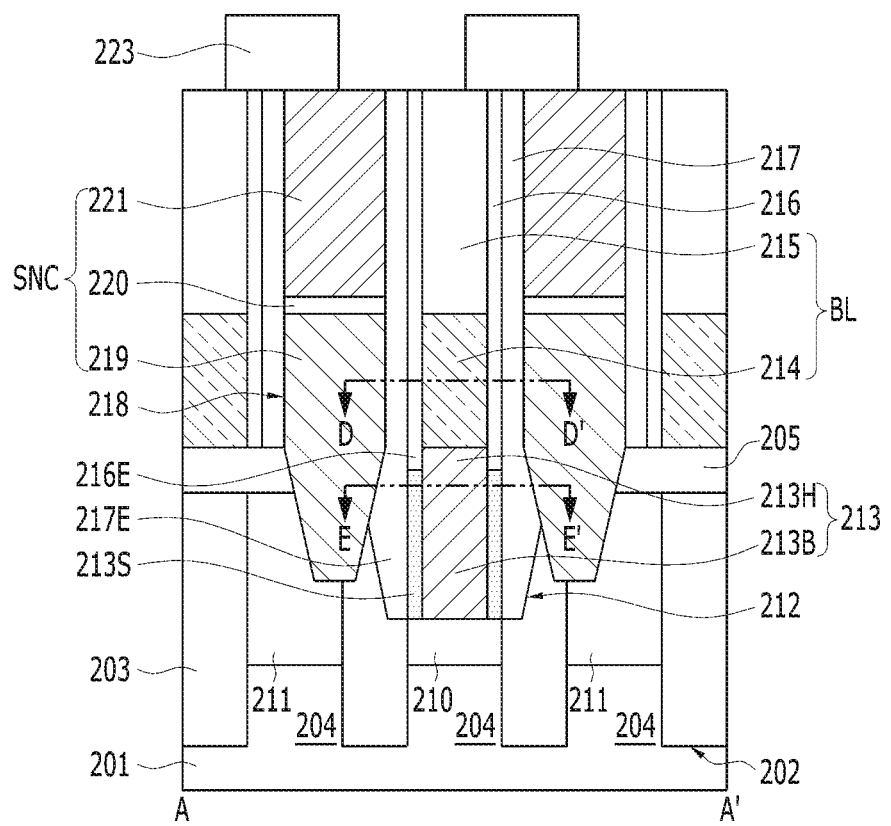
FIG. 8B is a cross-sectional view of the semiconductor device taken along a line A-A' shown in FIG. 8A.
Figure 8C:
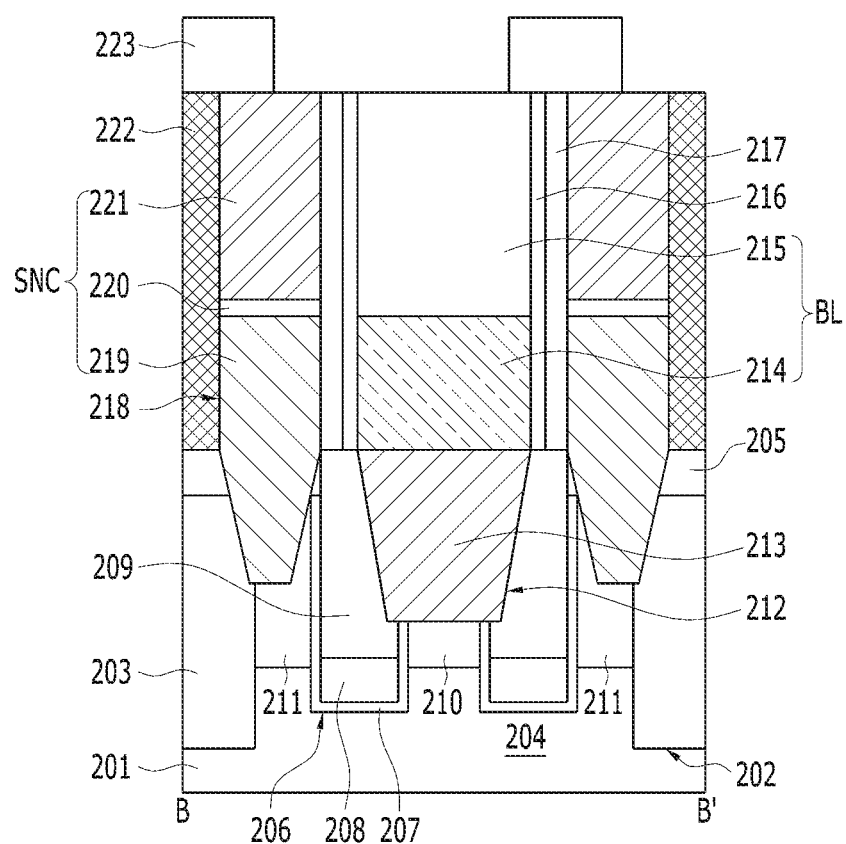
FIG. 8C is a cross-sectional view of the semiconductor device taken along a line B-B' shown in FIG. 8A.
Figure 9A:
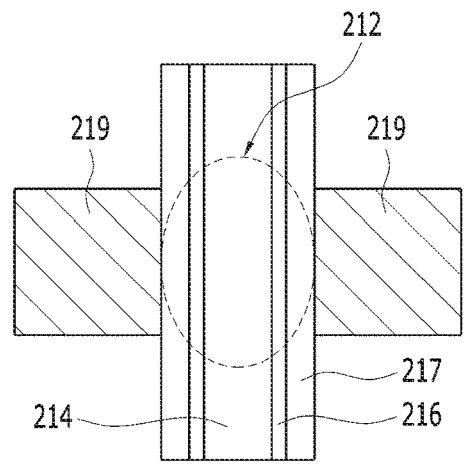
FIG. 9A is a cross-sectional view of the semiconductor device taken along a line D-D' shown in FIG. 8B.
Figure 9B:
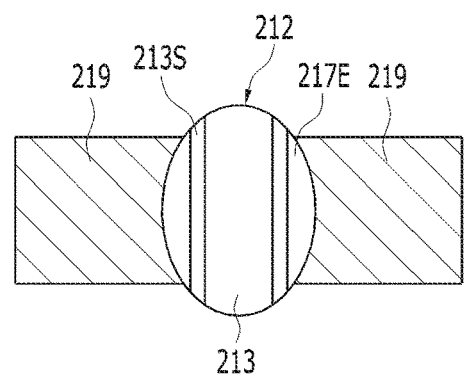
FIG. 9B is a cross-sectional view of the semiconductor device taken along a line E-E' shown in FIG. 8B.
Figure 9C:
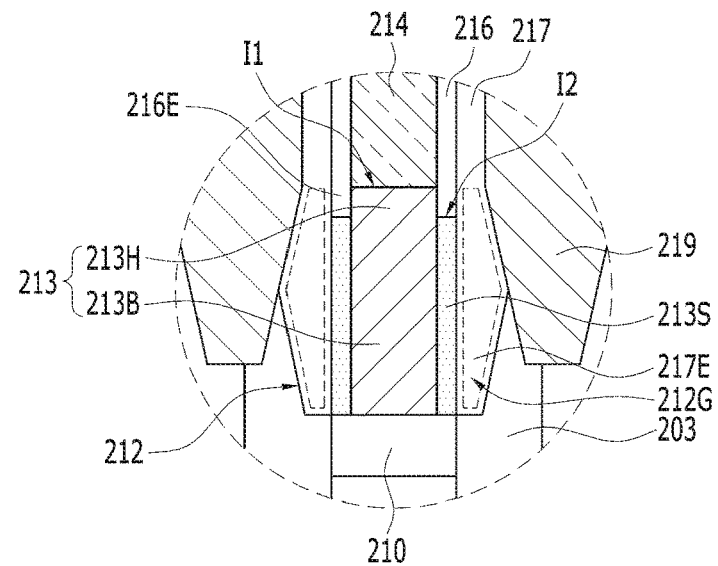
FIG. 9C illustrates a bit line contact plug and its surrounding in detail.

FIG. 8A is a plan view illustrating the semiconductor device in accordance with the second embodiment of the present invention. FIG. 8B is a cross-sectional view of the semiconductor device taken along a line A-A' shown in FIG. 8A. FIG. 8C is a cross-sectional view of the semiconductor device taken along a line B-B' shown in FIG. 8A. FIG. 9A is a cross-sectional view of the semiconductor device taken along a line D-D' shown in FIG. 8B. FIG. 9B is a cross-sectional view of the semiconductor device taken along a line E-E' shown in FIG. 8B. FIG. 9C illustrates a bit line contact plug and its surrounding in detail.

The semiconductor device 200 may include a plurality of memory cells. Each of the memory cells may include a cell transistor including a buried word line 208, a bit line 214, and a memory element 223.

Hereafter, the semiconductor device 200 is described in detail.

An isolation layer 203 and an active region 204 may be formed in a substrate 201. The isolation layer 203 may define a plurality of active regions 204. The substrate 201 may include a material that is appropriate for semiconductor processing. The substrate 201 may include a semiconductor substrate. The substrate 201 may be formed of a silicon-containing material. The substrate 201 may include one selected from a group including silicon, monocrystalline silicon, polysilicon, amorphous silicon, a silicon germanium, a monocrystalline silicon germanium, a polycrystalline silicon germanium, a carbon-doped silicon, a combination thereof, or a multi-layer of two or more of them. The substrate 201 may include another semiconductor material, such as germanium. The substrate 201 may include a semiconductor substrate of a III/V-group material, e.g., a compound such as gallium arsenide (GaAs). The substrate 201 may include a Silicon-On-Insulator (SOI) substrate. The isolation layer 203 may be formed in the inside of an isolation trench 202.

A gate trench 206 may be formed in the substrate 201. A gate insulating layer 207 may be formed over the surface of the gate trench 206. The buried word line 208 filling a portion of the gate trench 206 may be formed over the gate insulating layer 207. A sealing layer 209 may be formed over the buried word line 208. The sealing layer 209 may have a height as high as the surface of the substrate 201. The buried word line 208 may be formed of a low-resistance metal material. For example, in an embodiment, the buried word line 208 may have a stacked structure where a titanium nitride and tungsten are sequentially stacked. In another embodiment of the present invention, the buried word line 208 may be formed of a titanium nitride (TiN) only.

First and second source/drain regions 210 and 211 may be formed in the substrate 201. The first source/drain region 210 and the second source/drain region 211 may be spaced apart from each other by the gate trench 206. The buried word line 208, the first source/drain region 210, and the second source/drain region 211 may form a cell transistor. The cell transistor may improve a short-channel effect caused by the buried word line 208.

A bit line contact plug 213 may be formed over the substrate 201. The bit line contact plug 213 may be coupled to the first source/drain region 210. The bit line contact plug 213 may be disposed in the inside of a bit line contact hole 212. The bit line contact hole 212 may be pass through an inter-layer dielectric layer 205. The inter-layer dielectric layer 205 may be formed over the substrate 201. The bit line contact hole 212 may be extended to expose the first source/drain region 210. The lower surface of the bit line contact plug 213 may be lower than the upper surface of the substrate 201. The bit line contact plug 213 may be formed of a silicon-containing layer. A portion of the bit line contact plug 213 may have a shorter line width than the radius of the bit line contact hole 212. The bit line contact plug 213 may include a plug body 213B and a plug head 213H.

A bit line 214 may be formed over the bit line contact plug 213. A bit line hard mask layer 215 may be formed over the bit line 214. The bit line 214 may have a shape of a line that is extended in a direction intersecting with the buried word line 208. A portion of the bit line 214 may be coupled to the bit line contact plug 213. In the A-A' direction, the bit line 214 and the bit line contact plug 213 may have the same line width. Therefore, the bit line 214 may be extended in one direction while covering the bit line contact plug 213. The bit line 214 may be formed of a metal material. The bit line hard mask layer 215 may include an insulating material. The bit line 214 and the bit line hard mask layer 215 may be simply referred to as 'a bit line structure BL'.

A first spacer 216 may be formed on the side wall of the bit line 214 and the bit line hard mask layer 215. A second spacer 213S may be formed on both side walls of the bit line contact plug 213. A third spacer 217 may be formed on the side wall of the first spacer 216. A first spacer extended portion 216E may cover the side wall of the plug head 213H of the bit line contact plug 213. The second spacer 213S may be covered by a third spacer extended portion 217E. The first spacer extended portion 216E may be extended from the first spacer 216. The third spacer extended portion 217E may be extended from the third spacer 217. The second spacer 213S and the third spacer extended portion 217E may form a dielectric plug DP. The second spacer 213S may be formed by selectively oxidizing the side wall of the plug body 213B.

A storage node contact plug SNC may be formed between the neighboring bit line structures BL. The storage node contact plug SNC may be formed in a storage node contact hole 218. The storage node contact hole 218 may have a high aspect ratio. The storage node contact plug SNC may be coupled to the second source/drain region 211. The storage node contact plug SNC may include a silicon plug 219 and a metal plug 221. The metal plug 221 may be disposed adjacent to the bit line hard mask layer 215. The silicon plug 219 may be disposed adjacent to the bit line contact plug 213 and the bit line 214. In the direction (which is the C-C' direction of FIG. 8A) parallel to the bit line structure BL, a plug isolation layer 222 may be formed between the neighboring storage node contact plugs SNC. The plug isolation layer 222 formed between the neighboring storage node contact plugs SNC may provide the storage node contact hole 218 along with the inter-layer dielectric layer 205.

The storage node contact plug SNC may further include a metal silicide layer 220 between the silicon plug 219 and the metal plug 221.

A memory element 223 may be formed over the storage node contact plug SNC. The memory element 223 may include a capacitor including a storage node. The storage node may include a pillar type. Although not illustrated, a dielectric layer and a plate node may be further formed over the storage node. The storage node may have a cylindrical shape other than a pillar shape. According to another embodiment of the present invention, the memory element that may be realized in diverse formed may be formed over the storage node contact plug SNC.

Referring to FIG. 9A, a double spacer formed of the first spacer 216 and the third spacer 217 may be formed between the bit line 214 and the silicon plug 219.

Referring to FIG. 9B, a double spacer formed of the second spacer 213S and the third spacer extended portion 217E may be formed between the bit line contact plug 213 and the silicon plug 219. Since the second spacer 213S includes a silicon oxide, a parasitic capacitance between the bit line contact plug 213 and the silicon plug 219 may be improved.

Referring to FIG. 9C, the first spacer extended portion 216E may cover both side walls of the plug head 213H. The contact interface I1 between the bit line 214 and the bit line contact plug 213 may be protected by the first spacer extended portion 216E. Therefore, it is possible to prevent failure between the bit line 214 and the storage node contact plug SNC.

Also, since the second spacer 213S is formed through the selective oxidation of the plug body 213B, the performance of the third spacer extended portion 217E filling a gap 212G may be improved. As a comparative example, when the second spacer 213S is formed through a deposition process, it is difficult to secure a gap-fill space of the third spacer extended portion 217E. The gap 212G may be disposed between the bit line contact plug 213 and the silicon plug 219. As for the position of the gap 212G, the gap G of FIG. 10I may be referred to.

FIGS. 10A to 10L are cross-sectional views illustrating a method for fabricating the semiconductor device in accordance with the second embodiment of the present invention. In a DRAM device, a peripheral circuit region for controlling the input/output of data into/from a memory cell may be generally disposed other than a cell region where a memory cell is formed. When a plurality of elements are formed in a cell region and a peripheral circuit region, some of the elements may be formed concurrently, that is, some of the elements may be formed to be merged. Hereafter, an example of the fabrication method is described according to the A-A' direction of FIG. 8A.

Figure 10A:
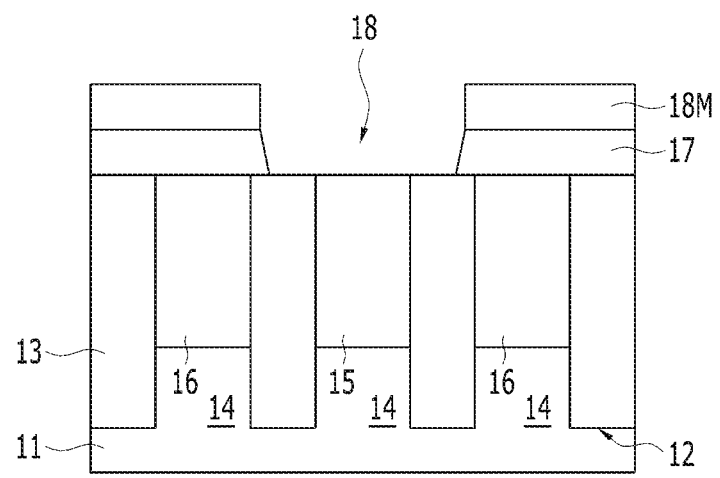
FIGS. 10A to 10L are cross-sectional views illustrating a method for fabricating the semiconductor device in accordance with the embodiment of the present invention.

Referring to FIG. 10A, an isolation layer 13 may be formed in a substrate 11.

The isolation layer 13 may define active regions 14. The isolation layer 13 may be formed through a Shallow Trench Isolation (STI) process. The STI process may be performed as follows. An isolation trench 12 may be formed by etching the substrate 11. The isolation trench 12 may be filled with an insulating material to form the isolation layer 13. The isolation layer 13 may be formed of a suitable material including a silicon oxide, a silicon nitride, or a combination thereof. The isolation trench 12 may be filled with an insulating material through a Chemical Vapor Deposition (CVD) or other deposition processes. A planarization process such as a Chemical-Mechanical Polishing (CMP) may be additionally used.

Subsequently, although not illustrated, a gate trench 206, a gate insulating layer 207, a buried word line 208, and a sealing layer 209 may be formed.

After a buried word line structure is formed, a first impurity region 15 and a second impurity region 16 may be formed. The first impurity region 15 and the second impurity region 16 may be formed in active regions 14 on both sides of the buried word line structure. The first impurity region 15 and the second impurity region 16 may be formed through a doping process, such as an ion implantation process. The first impurity region 15 and the second impurity region 16 may have the same height. According to another embodiment of the present invention, the first impurity region 15 may be deeper than the second impurity region 16. The first impurity region 15 and the second impurity region 16 may be referred to as 'a first source/drain region and a second source/drain region'.

As described above, a substrate which is capped with an insulating material, which is simply referred to as an insulating material-capped substrate, may be formed by the substrate 11, the isolation layer 13, and the sealing layer 209. For example, the substrate 11 capped with the isolation layer 13 and the sealing layer 209 may correspond to the substrate structure 101 of FIG. 4A. When the isolation layer 13 and the sealing layer 209 are formed of a silicon nitride, the insulating material-capped substrate may become a nitride-capped semiconductor substrate.

Subsequently, an inter-layer dielectric layer 17 may be formed over the substrate 11. The inter-layer dielectric layer 17 may be formed of a material having an etch selectivity with respect to the substrate 11. The inter-layer dielectric layer 17 may be formed of a suitable material including a silicon oxide. In an embodiment, the inter-layer dielectric layer 17 may be formed of a TEOS (Tetra-Ethyl-Ortho-Silicate). According to another embodiment of the present invention, the inter-layer dielectric layer 17 may be referred to as a hard mask layer. For example, the inter-layer dielectric layer 17 may be used as an etch barrier for forming a gate trench. Therefore, the remaining hard mask layer that remains after the buried word line structure is formed may serve as the inter-layer dielectric layer 17.

Subsequently, a contact hole 18 may be formed. The contact hole 18 may be formed by using a contact mask 18M and etching the inter-layer dielectric layer 17. The contact hole 18 may have a circular shape or an oval shape from the perspective of a plan view. The contact hole 18 may expose a portion of the substrate 11. The contact hole 18 may have a radius that is controlled to have a predetermined line width. The contact hole 18 may have a shape that exposes a portion of the first impurity region 15 and a portion of the isolation layer 13.

Figure 10B:
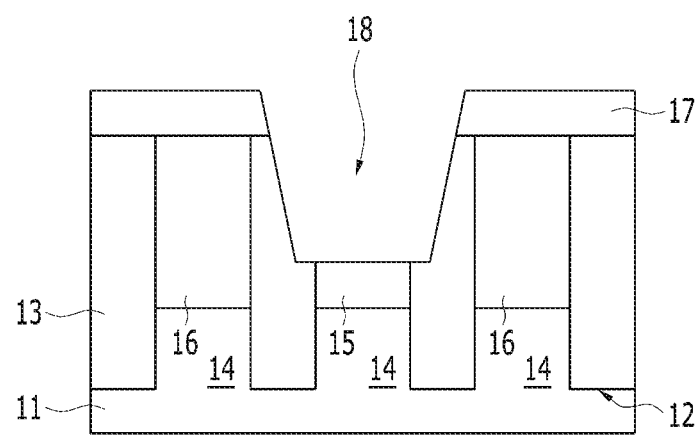

Referring to FIG. 10B, the bottom portion of the contact hole 18 may be extended into the inside of the substrate 11. For example, the first impurity region 15 and the isolation layer 13 below the contact hole 18 may be recessed to a predetermined depth. Subsequently, the contact mask 18M may be removed. The contact hole 18 may include the upper contact hole 103U and the lower contact hole 103L that are illustrated in FIGS. 4C and 4D, respectively.

The contact hole 18 may have a high aspect ratio. Since the contact hole 18 is formed by recessing the substrate 11 to the predetermined depth, cell resistance may be decreased.

The resultant structure including the contact hole 18 may be referred to as a substrate structure including the contact hole 18 of a high aspect ratio.

Figure 10C:
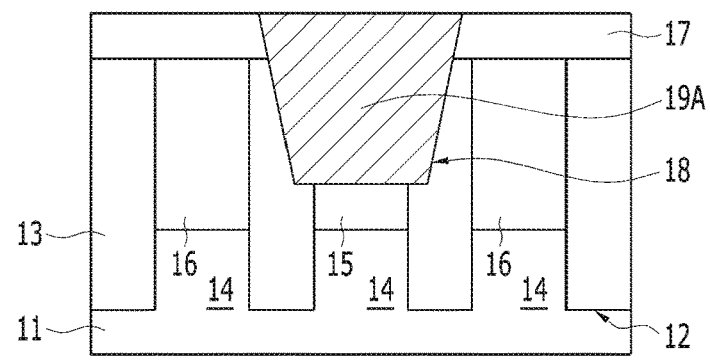

Referring to FIG. 10C, a first conductive layer 19A may be formed. The first conductive layer 19A may be formed by forming a conductive material (not shown) to fill the contact hole 18 and planarizing the conductive material through an etch-back process or a Chemical Mechanical Polishing (CMP) process.

The first conductive layer 19A may be formed of a metal or a metal-containing material or a silicon-containing material. The first conductive layer 19A may be formed of polysilicon.

According to another embodiment of the present invention, the first conductive layer 19A may be formed through a Selectively Epitaxial Growth (SEG). For example, the first conductive layer 19A may include a SEG-SiP. The first conductive layer 19A may be formed through the SEG without void.

The upper surface of the first conductive layer 19A and the upper surface of the inter-layer dielectric layer 17 may be disposed at the same level.

Figure 10D:
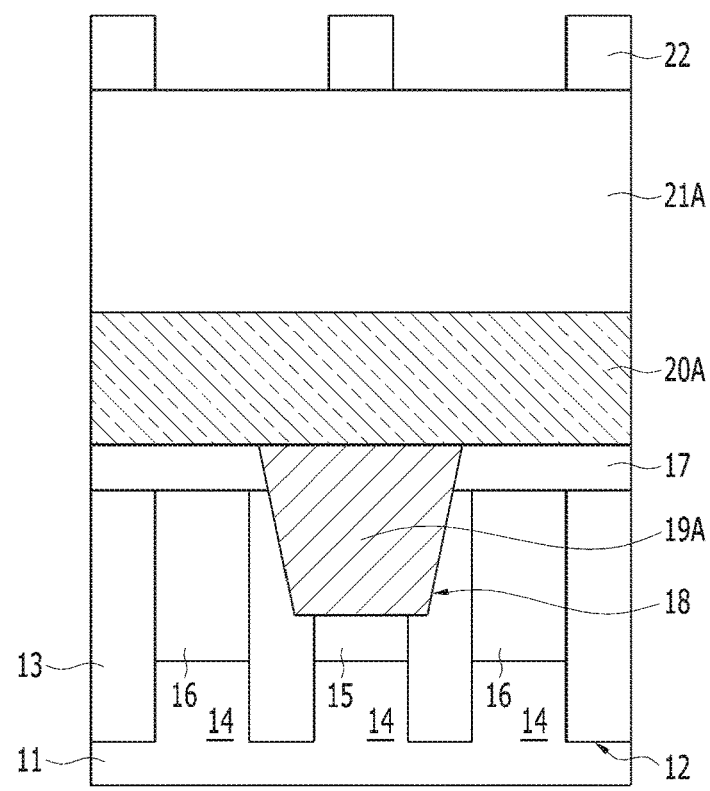

Referring to FIG. 10D, a second conductive layer 20A and a hard mask material layer 21A may be stacked. The second conductive layer 20A and the hard mask material layer 21A may be sequentially stacked over the first conductive layer 19A and the inter-layer dielectric layer 17. The second conductive layer 20A may be formed of a metal or a metal-containing material. The second conductive layer 20A may be formed of a metal, a metal nitride, a metal silicide, or a combination thereof. The second conductive layer 20A may be formed of a tungsten nitride (WN), a molybdenum nitride (MoN), a titanium nitride (TIN), a tantalum nitride (TaN), a titanium silicon nitride (TiSiN), a tantalum silicon nitride (TaSiN), tungsten (W), or a combination thereof. The hard mask material layer 21A may be formed of an insulating material having an etch selectivity with respect to the second conductive layer 20A and the first conductive layer 19A. The hard mask material layer 21A may be formed of a suitable material including a silicon oxide, a silicon nitride, or a combination thereof. In this embodiment of the present invention, the hard mask material layer 21A may be formed of a silicon nitride. The hard mask material layer 21A may also be referred to as a bit line hard mask material layer.

A bit line mask layer 22 may be formed over the hard mask material layer 21A. The bit line mask layer 22 may include a photoresist pattern. The bit line mask layer 22 may be formed through a patterning process, such as Spacer Patterning Technology (SPT) or Double Patterning Technology (DPT).

Figure 10E:
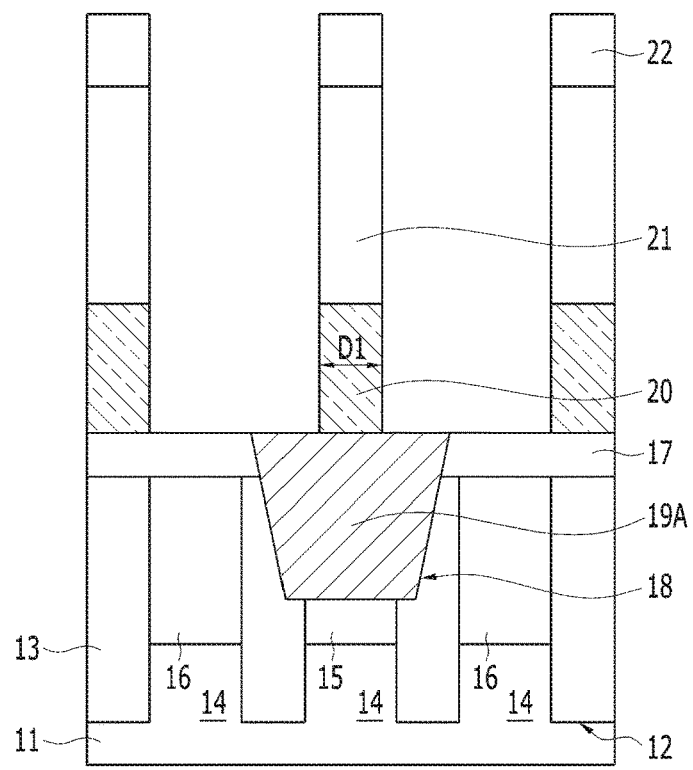

Referring to FIG. 10E, a bit line 20 and a bit line hard mask layer 21 may be formed. The hard mask material layer 21A and the second conductive layer 20A may be sequentially etched by using the bit line mask layer 22 as an etch barrier to form the bit line 20 and the bit line hard mask layer 21. The bit line 20 may be formed by etching the second conductive layer 20A. The bit line hard mask layer 21 may be formed by etching the hard mask material layer 21A. The etch process for forming the bit line 20 may include a dry etch process. The dry etch process may include an anisotropic etch process.

The bit line 20 and the bit line hard mask layer 21 may have the first critical dimension D1.

Figure 10F:
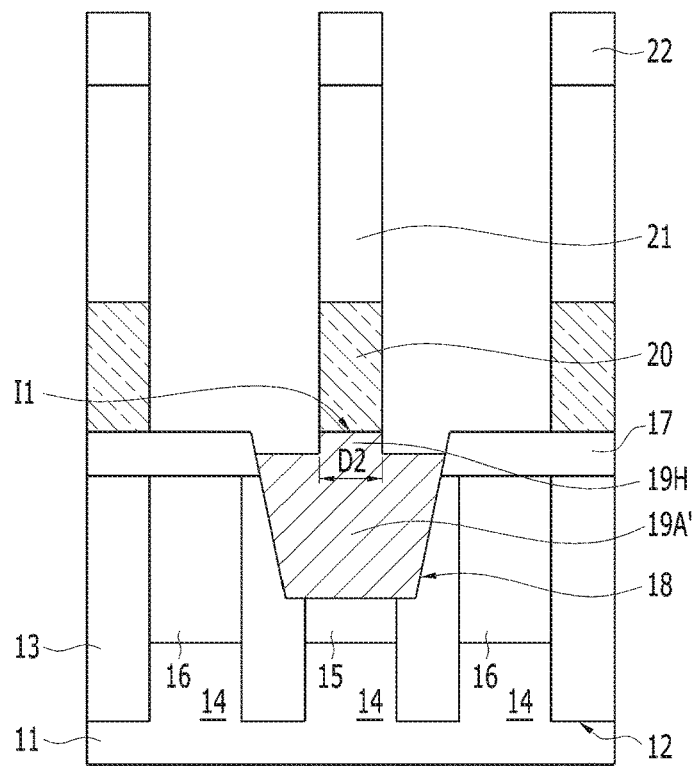

Referring to FIG. 10F, the first conductive layer 19A under the bit line 20 may be partially etched. The first conductive layer 19A may be partially dry-etched by using the bit line mask layer 22 as an etch barrier. As a result, the plug head 19H may be formed under the bit line 20. Under the plug head 19H, the first conductive layer may remain as 'a remaining first conductive layer 19A'. The upper surface of the remaining first conductive layer 19A' may have a surface that is recessed to be lower than the upper surface of the inter-layer dielectric layer 17.

The plug head 19H may have a second critical dimension D2. The plug head 19H and the bit line 20 may have the same critical dimension. In short, the first critical dimension D1 and the second critical dimension D2 may be the same.

A contact interface I1 may be formed between the plug head 19H and the bit line 20.

Figure 10G:
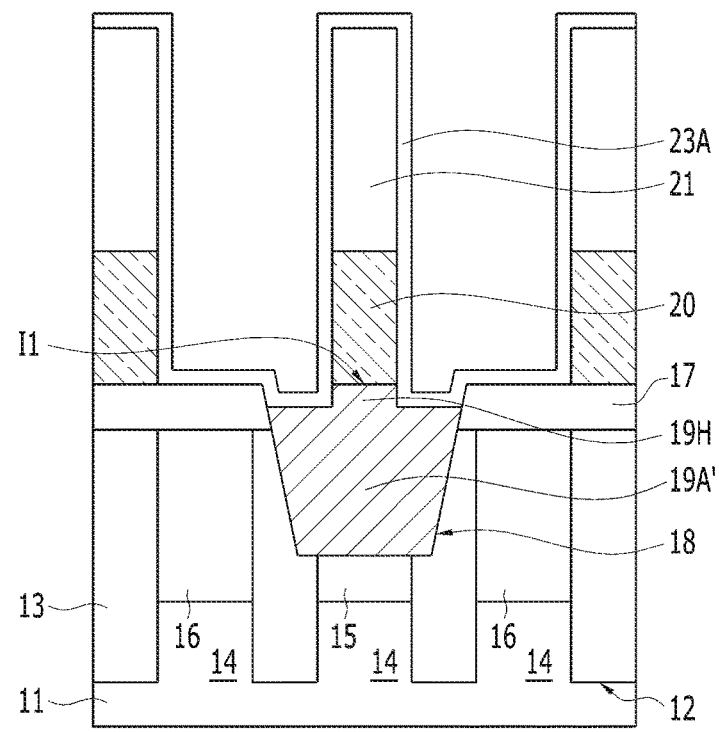

Referring to FIG. 10G, a first spacer layer 23A may be formed on both side walls of the bit line 20. Before the first spacer layer 23A is formed, the bit line mask layer 22 may be removed. The first spacer layer 23A may cover both side walls of the plug head 19H. The first spacer layer 23A may cover the upper surface of the remaining first conductive layer 19A'.

To form the first spacer layer 23A, an insulating material may be deposited over the bit line 20 and the bit line hard mask layer 21. The first spacer layer 23A may include a material having an etch selectivity with respect to the remaining first conductive layer 19A'. For example, the first spacer layer 23A may include a silicon nitride.

Figure 10H:
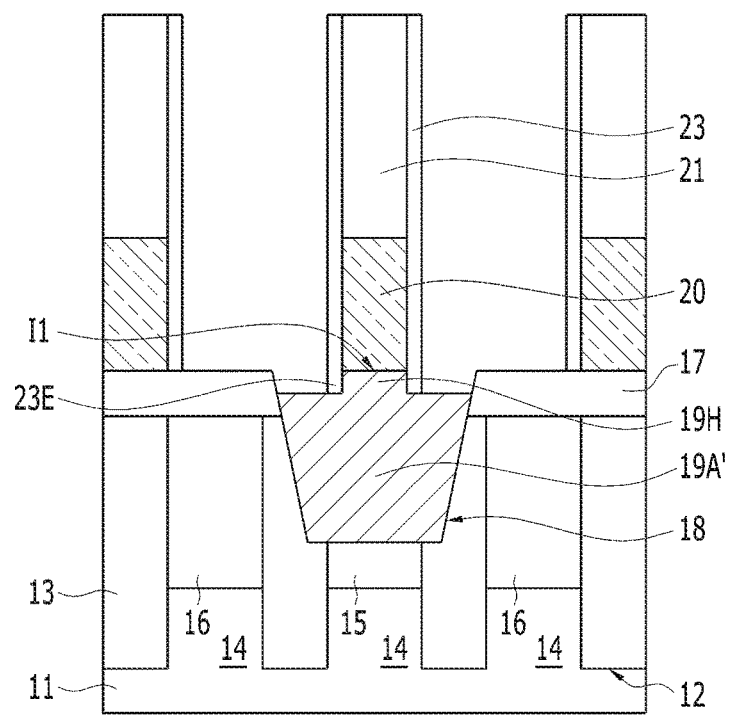

Referring to FIG. 10H, the first spacer 23 may be formed. The first spacer 23 may be formed by selectively removing the first spacer layer 23A from the upper surface of the bit line hard mask layer 21, the upper surface of the remaining first conductive layer 19A', and the upper surface of the inter-layer dielectric layer 17. As a result, the first spacer 23 may be formed on both side walls of the bit line 20 and the bit line hard mask layer 21. The first spacer 23 may be extended to cover both side walls of the plug head 19H. The upper surface of the remaining first conductive layer 19A' may be exposed.

The first spacer 23 may be parallel to both side walls of the bit line 20 and the bit line hard mask layer 21. The bottom portion of the first spacer 23, i.e., a first spacer extended portion 23E, may cover both side walls of the plug head 19H. The first spacer 23 and the first spacer extended portion 23E may be in continuum and they may be formed of the same material.

The first spacer extended portion 23E may cover both side walls of the contact interface I1.

Figure 10I:
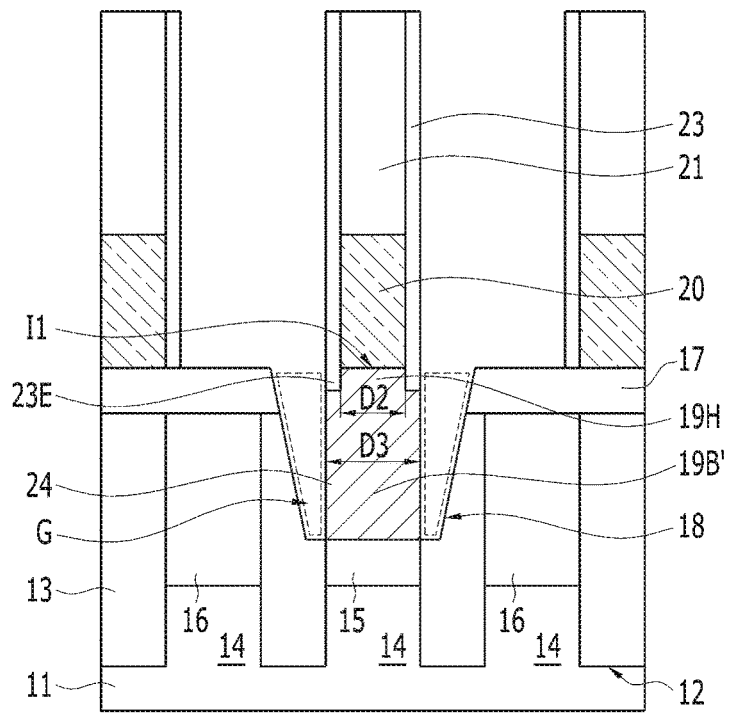

Referring to FIG. 10I, the remaining first conductive layer 19A' may be etched. For example, the remaining first conductive layer 19A' may be dry etched to expose the bottom surface of the contact hole 18. The remaining first conductive layer 19A' may be etched to form a plug body 19B' aligned with the outer surface of the first spacer 23.

The plug body 104B' may be formed over the first impurity region 15. The plug head 19H may be disposed over the plug body 19B'. The plug body 19B' and the plug head 19H may be disposed in the inside of the contact hole 18. The line width of the plug body 19B' may be shorter than the radius of the contact hole 18. Therefore, a gap G may be formed on both side walls of the plug body 19B'.

The gap G may be disposed in the inside of the contact hole 18. This is because the plug body 19B' is formed by being etched smaller than the radius of the contact hole 18. The gap G is not of a form surrounding the plug body 19B' but the gap G is independently formed on both side walls of the plug body 19B'. After all, one plug body 19B' and a pair of gaps G are disposed in the inside of the contact hole 18, and the pair of the gaps G may be separated by the plug body 19B'.

The plug body 19B' may have a third critical dimension D3. The third critical dimension D3 may be greater than the first critical dimension D1 and the second critical dimension D2. In other words, the plug body 19B' may have a greater critical dimension than the plug head 19H and the bit line 20.

The plug head 19H may contact the bit line 20. The contact interface I1 between the plug head 19H and the bit line 20 may be at the same level as the upper surface of the inter-layer dielectric layer 17.

Both side walls of the plug body 19B' may not be covered by the first spacer extended portion 23E. Both side walls of the plug head 19H may be covered by the first spacer extended portion 23E. Both side walls of the bit line 20 and the bit line hard mask layer 21 may be covered by the first spacer 23.

As described above, since both side walls of the bit line 20 are covered by the first spacer 23, the bit line 20 may be protected from etch attack during the process of etching the remaining first conductive layer 19A'. Also, the contact interface I1 between the bit line 20 and the plug head 19H may be protected from the etch attack.

Figure 10J:
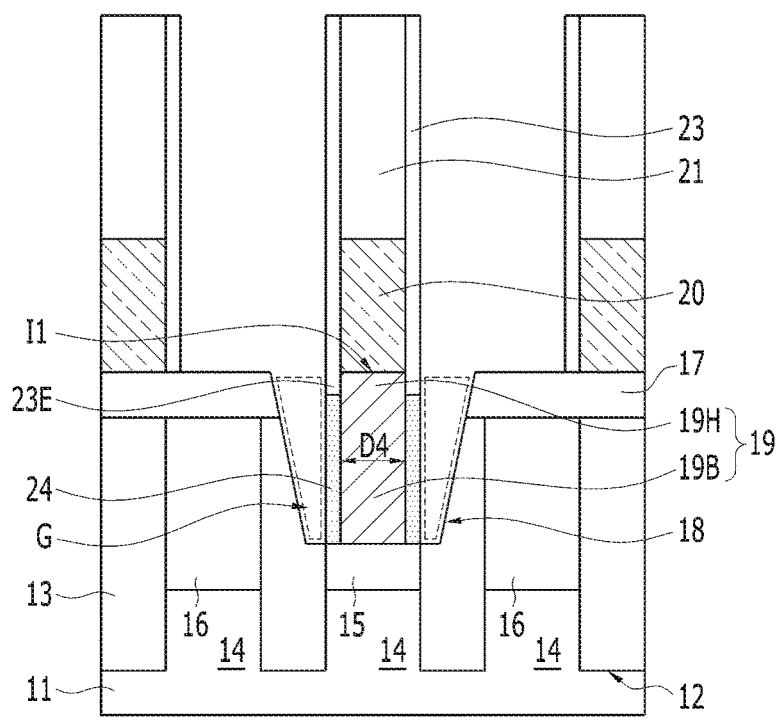

Referring to FIG. 10J, a second spacer 24 may be formed. The second spacer 24 may be formed on both side walls of the plug body 19B'. The second spacer 24 may be formed through an oxidation process. For example, the second spacer 24 may be formed by selectively oxidizing both side walls of the plug body 19B'. When the plug body 19B' includes polysilicon, the second spacer 24 may be of a silicon oxide.

During the oxidation process for forming the second spacer 24, the first spacer 23 may protect both side walls of the bit line 20. Therefore, it is possible to selectively oxidize both side walls of the plug body 19B' while suppressing the oxidation of the bit line 20. The second spacer 24 may decrease the critical dimension of the plug body 19B'. In other words, the plug body may remain as a remaining plug body 19B and the remaining plug body 19B may have a fourth critical dimension D4 which is decreased from the critical dimension of the plug body 19B'. The fourth critical dimension D4 may be the same as the second critical dimension D2 of the plug head 19H. According to another embodiment of the present invention, the fourth critical dimension D4 may be smaller than the second critical dimension D2.

The second spacer 24 may contact the lower portion of the first spacer 23, which is the first spacer extended portion 23E. Due to the presence of the first spacer extended portion 23E and the second spacer 24, the plug head 19H and the remaining plug body 19B may be sealed up airtight from the outside.

The second spacer 24 may not decrease the size of the gap G. The oxidation process should be controlled so that the size of the gap G is not excessively decreased, and prevent the side wall of the remaining plug body 19B from being lost excessively.

The second spacer 24 may have the same thickness as the first spacer extended portion 23E. According to another embodiment of the present invention, the second spacer 24 may be thicker than the first spacer extended portion 23E.

The remaining plug body 19B and the plug head 19H may form a bit line contact plug 19. The bit line contact plug 19 may be disposed in the inside of the contact hole 18. The gap G may be disposed on both side walls of the bit line contact plug 19. The contact interface I1 between the bit line contact plug 19 and the bit line 20 may be covered by the first spacer extended portion 23E.

Figure 10K:
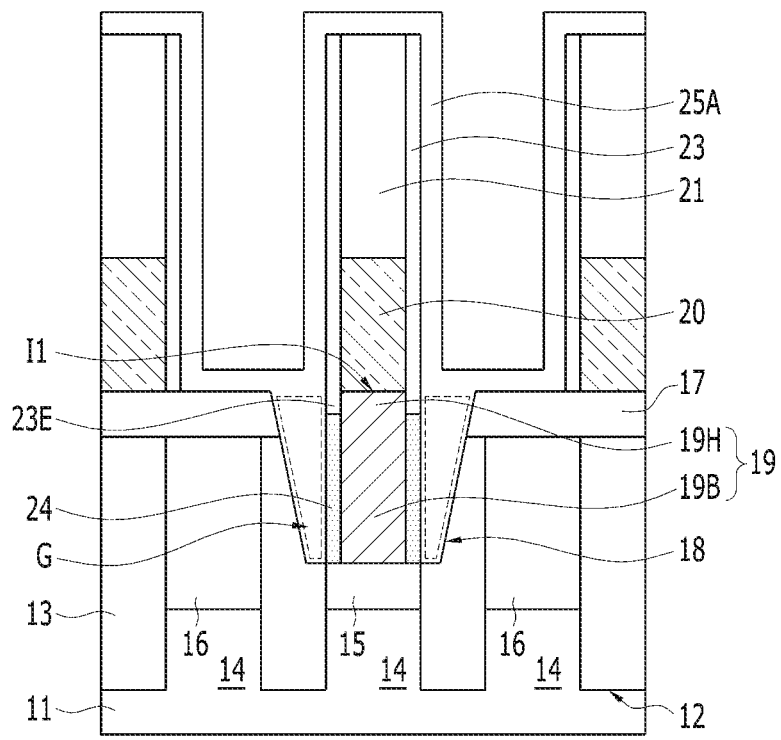
Figure 10L:
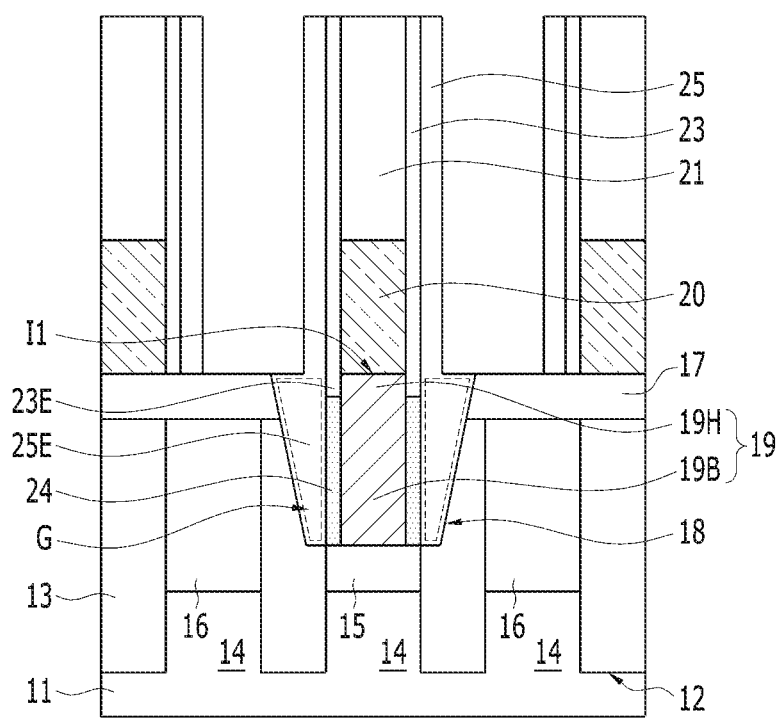

Referring to FIGS. 10K and 10L, a third spacer 25 may be formed. The third spacer 25 may be formed over the second spacer 24. The third spacer 25 may fill the gap G. The third spacer may be formed by depositing an insulating material and performing an etch-back process. For example, as illustrated in FIG. 10K, a third spacer layer 25A may be formed over the second spacer 24 and the first spacer 23. The third spacer layer 25A may fill the gap G. Since the second spacer 24 is formed through the selective oxidation, it is easy to fill the gap G with the third spacer layer 25A. Subsequently, as shown in FIG. 10L, an etch-back process may be performed onto the third spacer layer 25A to form the third spacer 25. The third spacer 25 may include a low dielectric material. The third spacer 25 may include a silicon nitride.

The third spacer 25 may be parallel to both side walls of the bit line 20. The bottom portion of the third spacer 25, i.e., a third spacer extended portion 25E, may fill the gap G. The third spacer extended portion 25E may cover the second spacer 24 and the first spacer extended portion 23E. The third spacer 25 and the third spacer extended portion 25E may be in continuum and they may be formed of the same material.

The contact hole 18 may be filled with the bit line contact plug 19, the first spacer extended portion 23E, the second spacer 24, and the third spacer extended portion 25E.

The first spacer extended portion 23E and the third spacer extended portion 25E may include a silicon nitride. The second spacer 24 may be formed of a suitable material including a silicon oxide. Therefore, an N-N (Nitride-Nitride) structure may be formed on the side wall of the plug head 19H, and an O-N (Oxide-Nitride) structure may be formed on the side wall of the remaining plug body 19B.

The first spacer 23 and the third spacer 25 may be formed on both side walls of the bit line 20. The plug head 19H of the bit line contact plug 19 may be covered by the first spacer extended portion 23E, and the remaining plug body 19B of the bit line contact plug 19 may be covered by the second spacer 24. The contact interface I1 between the plug head 19H and the bit line 20 may be sealed up airtight by the first spacer extended portion 23E.

FIGS. 11A to 11F are cross-sectional views illustrating a method for forming a storage node contact plug SNC of the semiconductor device in accordance with the second embodiment of the present invention. The storage node contact plug SNC may be formed after the third spacer 25 and the third spacer extended portion 25E of FIG. 10L are formed.

Figure 11A:
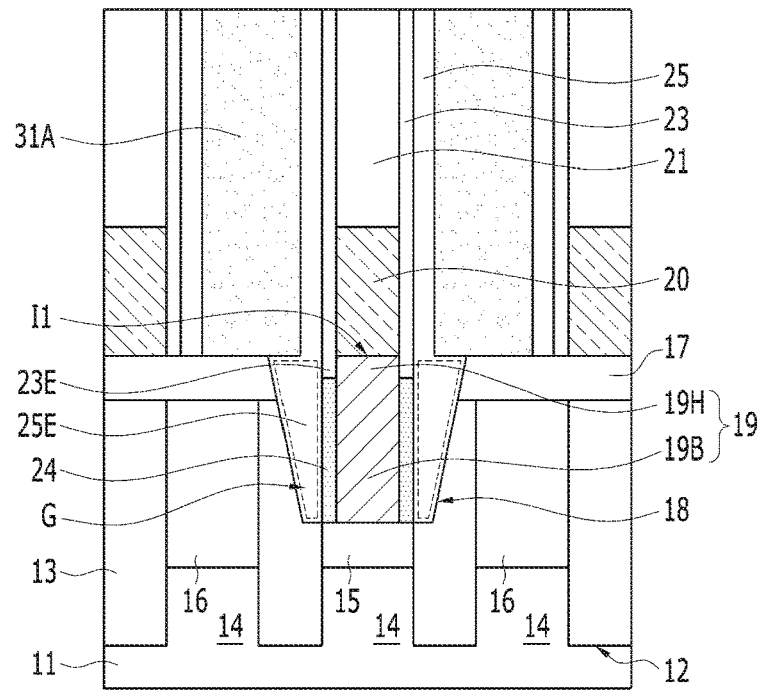
FIGS. 11A to 11F are cross-sectional views illustrating a method for forming a storage node contact plug of the semiconductor device in accordance with the embodiment of the present invention.

Referring to FIG. 11A, a sacrificial layer 31A may be formed. The sacrificial layer 31A may gap-fill the space between the neighboring bit lines 20. The sacrificial layer 31A may be formed of a suitable material including a silicon oxide. The sacrificial layer 31A may include a Spin-On-Dielectric (SOD) material. Subsequently, the sacrificial layer 31A may be planarized so that the upper surface of the bit line hard mask layer 21 is exposed. In this way, the sacrificial layer 31A of a linear shape may be formed between the bit lines 20. The sacrificial layer 31A may be extended parallel to the bit line 20. The first spacer 23 and the third spacer 25 may be disposed between the bit line 20 and the sacrificial layer 31A.

Figure 11B:
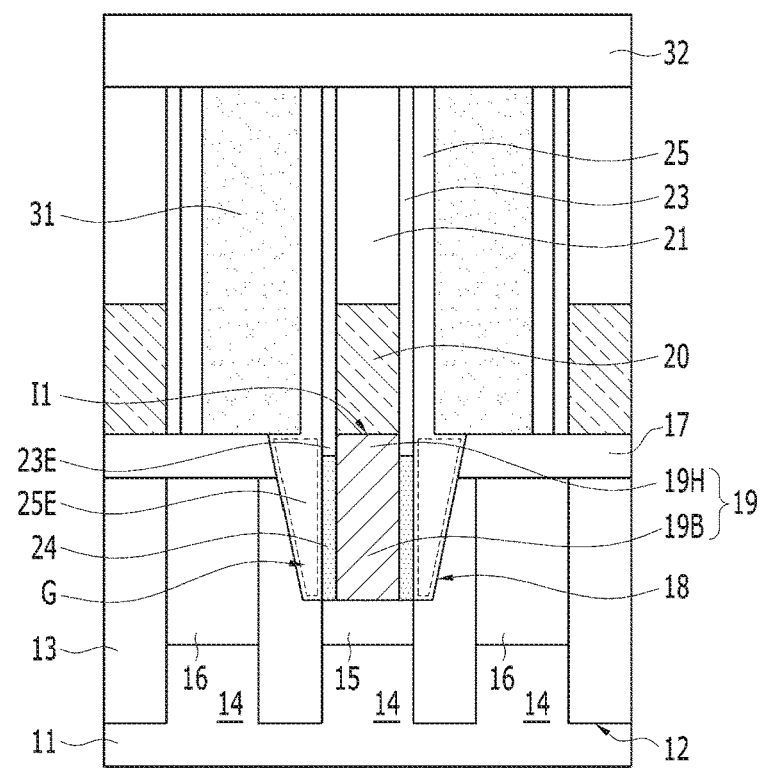

Referring to FIG. 11B, a plug isolation mask layer 32 may be formed. The plug isolation mask layer 32 may be patterned in a direction intersecting with the bit line 20. The plug isolation mask layer 32 may have a linear shape. The plug isolation mask layer 32 may include a photoresist film pattern.

Subsequently, although not illustrated, a plug isolation layer (refer to '222' of FIG. 8C) may be formed by using the plug isolation mask layer 32 as an etch mask and etching the sacrificial layer 31A. The plug isolation layer 222 may have a shape of a line that is extended in a direction intersecting with the bit line 20. A sacrificial layer pattern 31 may remain in a non-overlap space where the plug isolation layer 222 and the bit line 20 do not intersect with each other. The sacrificial layer pattern 31 may also remain below the plug isolation mask layer 32.

Figure 11C:
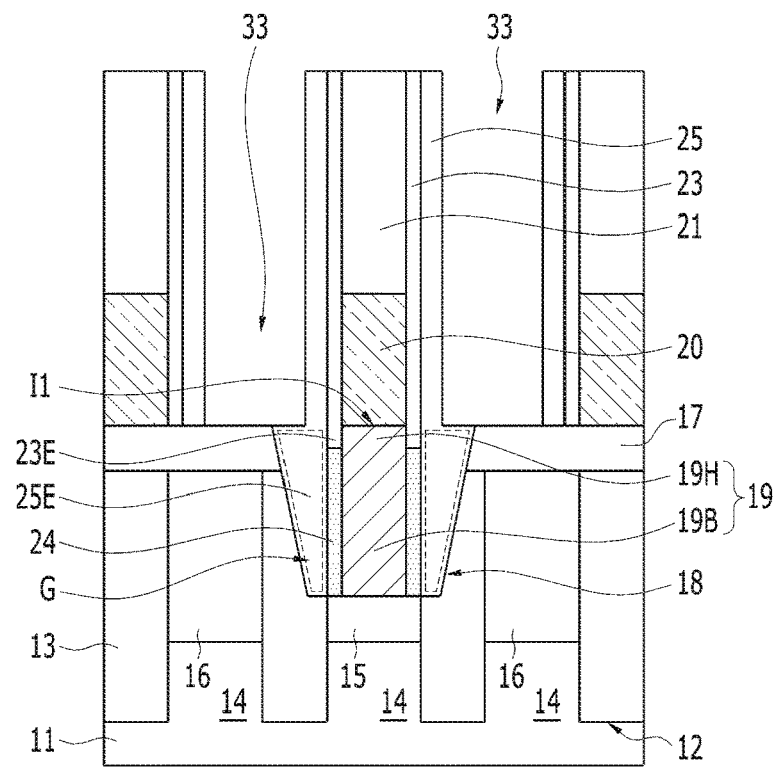

Referring to FIG. 11C, the plug isolation mask layer 32 and the sacrificial layer pattern 31 may be removed. The space from which the sacrificial layer pattern 31 is removed may become a storage node contact hole 33. A dip-out process may be applied to remove the sacrificial layer pattern 31. Through the dip-out process, the sacrificial layer pattern 31 may be selectively removed without losing the first spacer 23 and the third spacer 25. The storage node contact hole 33 may have a shape of a square hole from the perspective of a plan view.

Figure 11D:
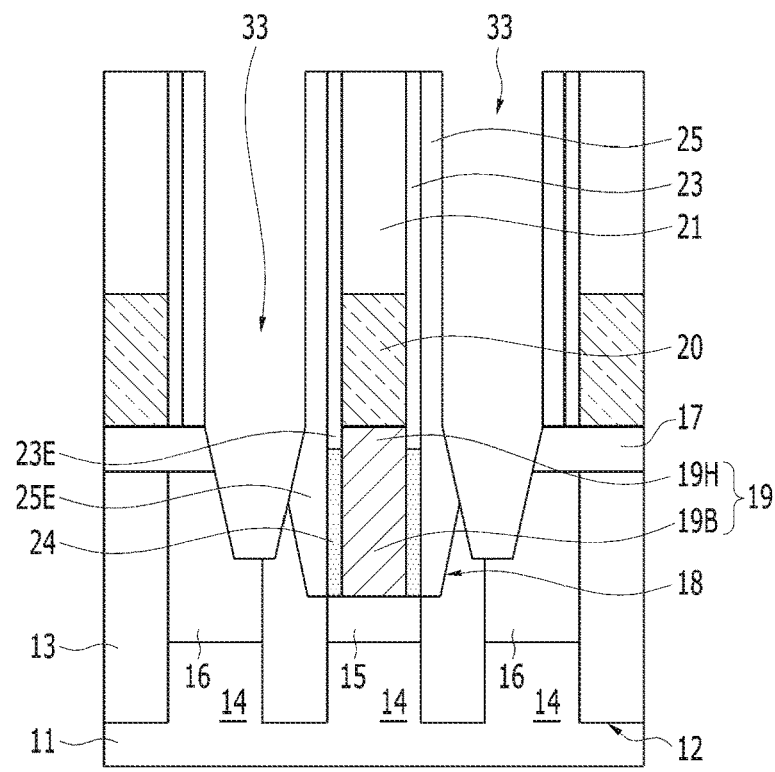

Referring to FIG. 11D, an etch process is performed to expose the second impurity region 16. This process may be referred to as an expansion process of the storage node contact hole 33. For example, the lower materials that are exposed by the third spacer 25 may be etched to be self-aligned to the third spacer 25. For example, after the inter-layer dielectric layer 17 is etched, a portion of the third spacer extended portion 25E may be etched. Through the etch process, the bottom portion of the storage node contact hole 33 may be expanded so that the second impurity region 16 may be exposed. Subsequently, a portion of the second impurity region 16 and a portion of the isolation layer 13 may be recessed to a predetermined depth.

Although not illustrated, the process of expanding the bottom portion of the storage node contact hole 33 may be performed in the side direction. For example, a portion of the inter-layer dielectric layer 17 may be isotropically etched through a wet etch process. This may be referred to as widening of the storage node contact hole 33.

Figure 11E:
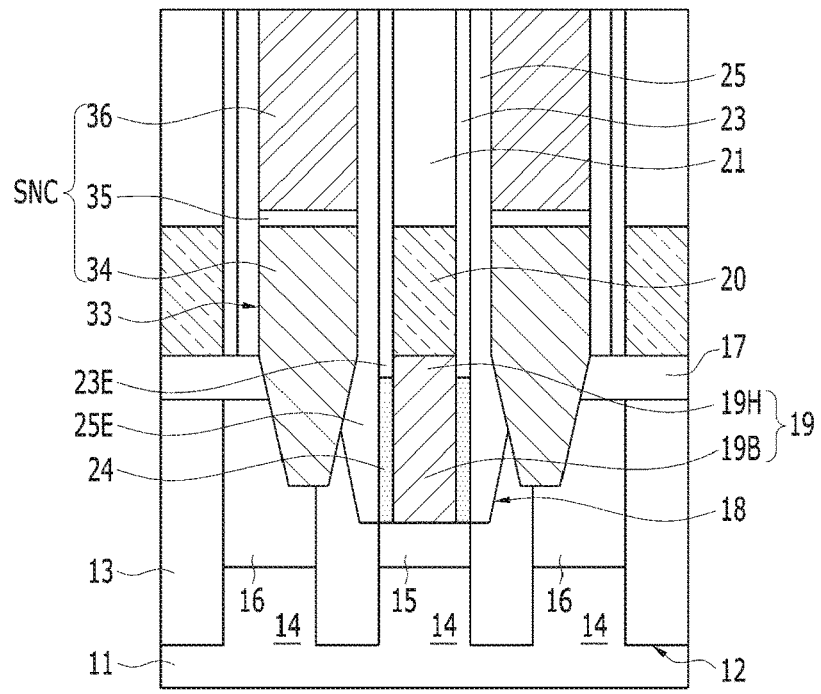

Referring to FIG. 11E, the storage node contact plug SNC may be formed. The storage node contact plug SNC may include a silicon plug 34, a metal silicide layer 35, and a metal plug 36.

The silicon plug 34 may be formed to be recessed in the inside of the storage node contact hole 33. The silicon plug 34 may include a silicon-containing layer. The silicon plug 34 may include a polysilicon layer. The polysilicon layer may be doped with an impurity. The silicon plug 34 may be coupled to the second impurity region 16. The silicon plug 34 may be formed by depositing a polysilicon layer and then performing an etch-back process.

The metal silicide layer 35 and the metal plug 36 may be disposed over the silicon plug 34. The metal plug 36 may be formed of a low-resistance metal material. The metal plug 36 may be formed of a metal-containing layer. The metal plug 36 may be formed of tungsten. According to another embodiment of the present invention, the upper portion of the metal plug 36 may be extended to overlap with the upper surface of the bit line hard mask layer 21.

The metal silicide layer 35 may be formed by depositing a silicidable metal layer and performing an annealing process. As a silicidation reaction may occur on the interface where the silicidable metal layer contacts the silicon plug 34, the metal silicide layer 35 may be formed. The metal silicide layer 35 may include a cobalt silicide.

The second spacer 24 and the third spacer extended portion 25E may be positioned between the silicon plug 34 and the remaining plug body 19B. For example, an O—N (oxide-nitride) structure may be formed between the silicon plug 34 and the remaining plug body 19B. Since the second spacer 24 formed of a silicon oxide is disposed, the parasitic capacitance between the silicon plug 34 and the remaining plug body 19B may be improved. According to another embodiment of the present invention, when a liner spacer 24L is formed as shown in FIG. 10N, an O—O—N (oxide-oxide-nitride) structure may be formed between the silicon plug 34 and the remaining plug body 19B.

Figure 11F:
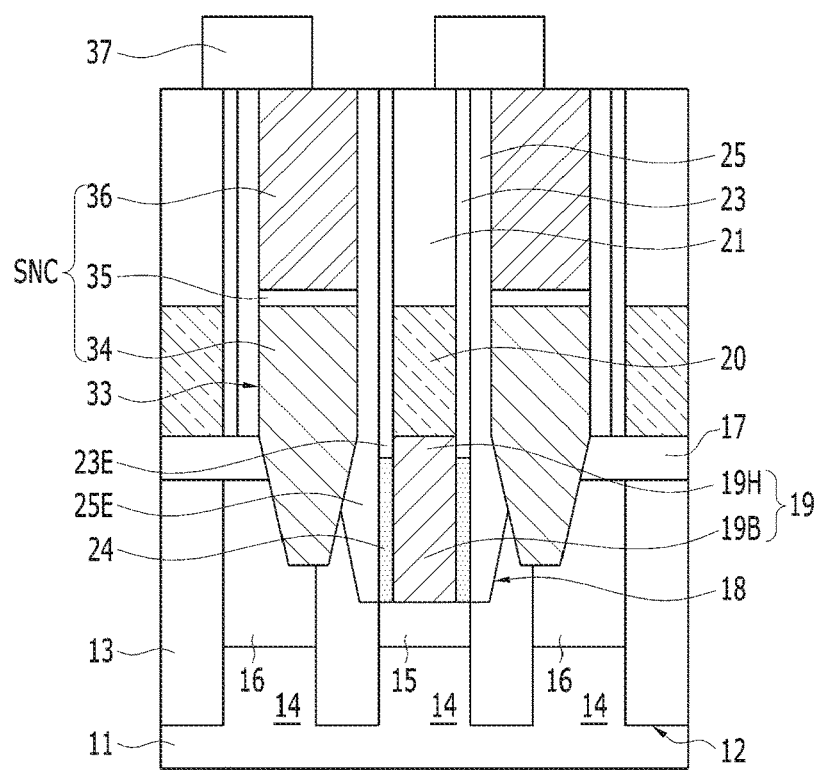

Referring to FIG. 11F, a memory element 37 that is electrically connected to the metal plug 36 may be formed. The memory element 37 may include a capacitor.

FIGS. 12A to 12E are cross-sectional views illustrating a method for fabricating a semiconductor device in accordance with a third embodiment of the present invention. The third embodiment may be similar to the second embodiment.

First of all, the substrate structure including up to the plug body 19B' may be formed through the process of FIGS. 10A and 10I.

Figure 12A:
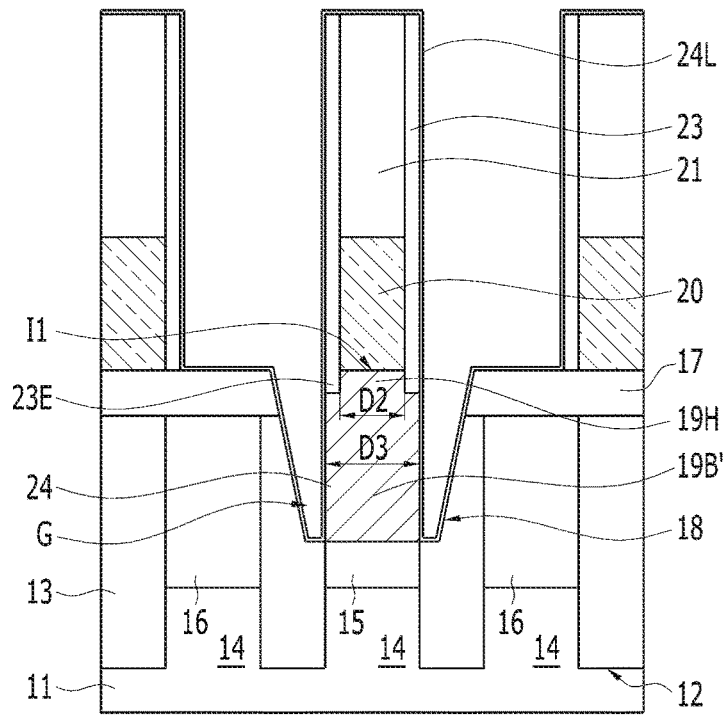
FIGS. 12A to 12E are cross-sectional views illustrating a method for fabricating a semiconductor device in accordance with an embodiment of the present invention.

Subsequently, referring to FIG. 12A, a liner spacer 24L may be formed. The liner spacer 24L may be conformally formed over the profile of the substrate structure including the plug body 19B'. The liner spacer 24L may be formed of a suitable material including a silicon oxide. The liner spacer 24L may be thin. In this way, the third spacer layer 25A may gap-fill the gap G without void subsequently.

Figure 12B:
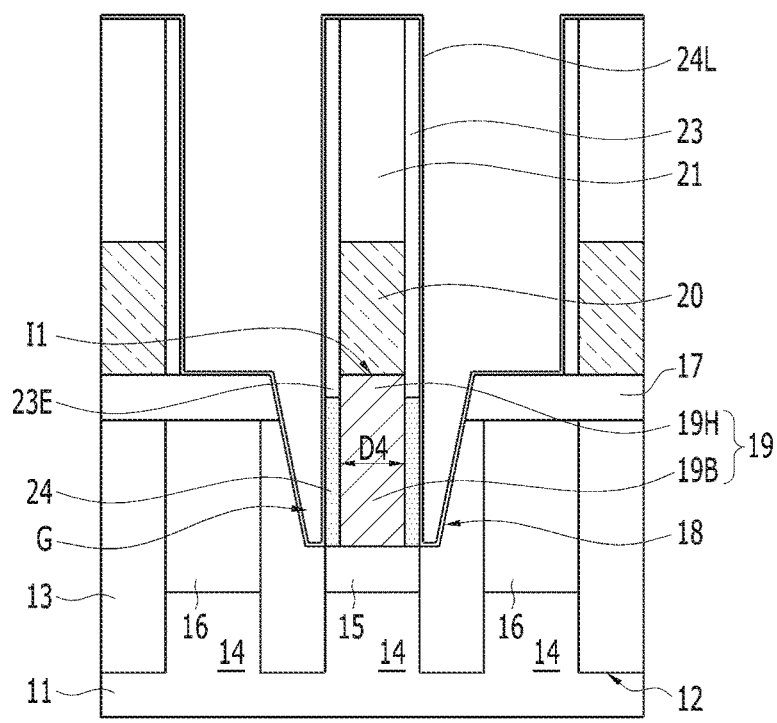

Referring to FIG. 12B, a selective oxidation may be performed in the presence of the liner spacer 24L. Through the selective oxidation, both side walls of the plug body 19B' may be selectively oxidized. The plug body may remain as a remaining plug body 19B, and the remaining plug body 19B may have a fourth critical dimension D4, which is decreased from the critical dimension of the plug body 19B'.

The second spacer 24 may contact the lower portion of the first spacer 23, which is the first spacer extended portion 23E. The first spacer extended portion 23E and the second spacer 24 may seal up the plug head 19H and the remaining plug body 19B airtight from the outside.

The second spacer 24 may have the same thickness as the first spacer extended portion 23E.

The remaining plug body 19B and the plug head 19H may form the bit line contact plug 19. The bit line contact plug 19 may be disposed in the inside of the contact hole 18. The gap G may be disposed on both side walls of the bit line contact plug 19. The contact interface I1 between the bit line contact plug 19 and the bit line 20 may be covered by the first spacer extended portion 23E.

The liner spacer 24L may remain continuously while the subsequent process is performed.

Figure 12C:
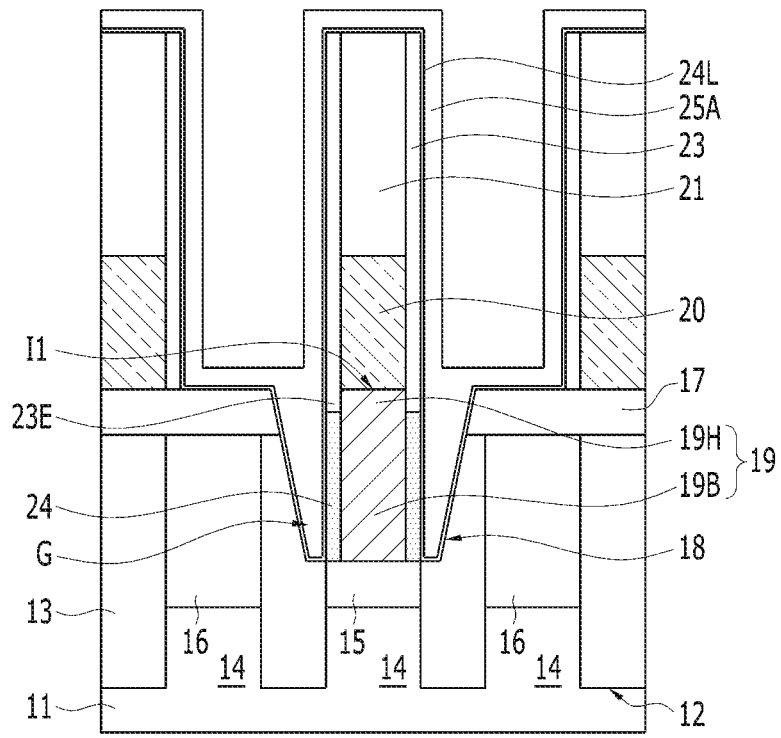

Referring to FIG. 12C, the third spacer layer 25A may be formed over the liner spacer 24L. The third spacer layer 25A may fill the gap G.

Figure 12D:
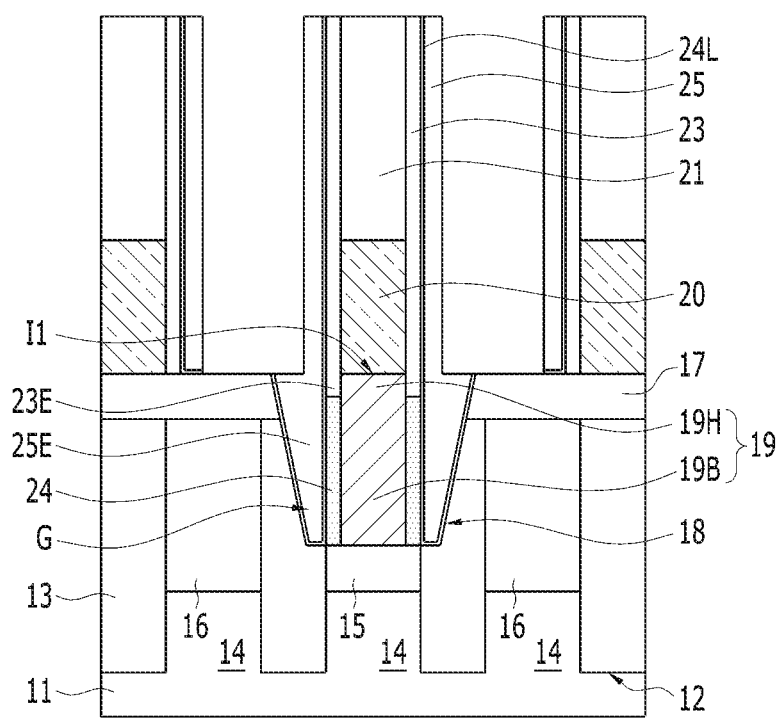

Referring to FIG. 12D, an etch-back process may be performed onto the third spacer layer 25A to form the third spacer 25. The third spacer 25 may include a low dielectric material. The third spacer 25 may include a silicon nitride.

The third spacer 25 may be parallel to both side walls of the bit line 20. The bottom portion of the third spacer 25, i.e., a third spacer extended portion 25E, may fill the gap G. The third spacer extended portion 25E may cover the liner spacer 24L and the first spacer extended portion 23E. The third spacer 25 and the third spacer extended portion 25E may be in continuum and they may be formed of the same material.

After the third spacer 25 is formed, the liner spacer 24L may be etched back. The liner spacer 24L may remain parallel to both side walls of the bit line 20. The lower portion of the liner spacer 24L may be extended to be disposed in the inside of the gap G. The liner spacer 24L and the third spacer extended portion 25E may fill the gap G.

The first spacer extended portion 23E and the third spacer extended portion 25E may include a silicon nitride. The second spacer 24 and the liner spacer 24L may be formed of a suitable material including a silicon oxide. Therefore, an N—O—N (Nitride-Oxide-Nitride) structure may be formed on the side wall of the plug head 19H, and an O—O—N (Oxide-Oxide-Nitride) structure may be formed on the side wall of the remaining plug body 19B.

Figure 12E:
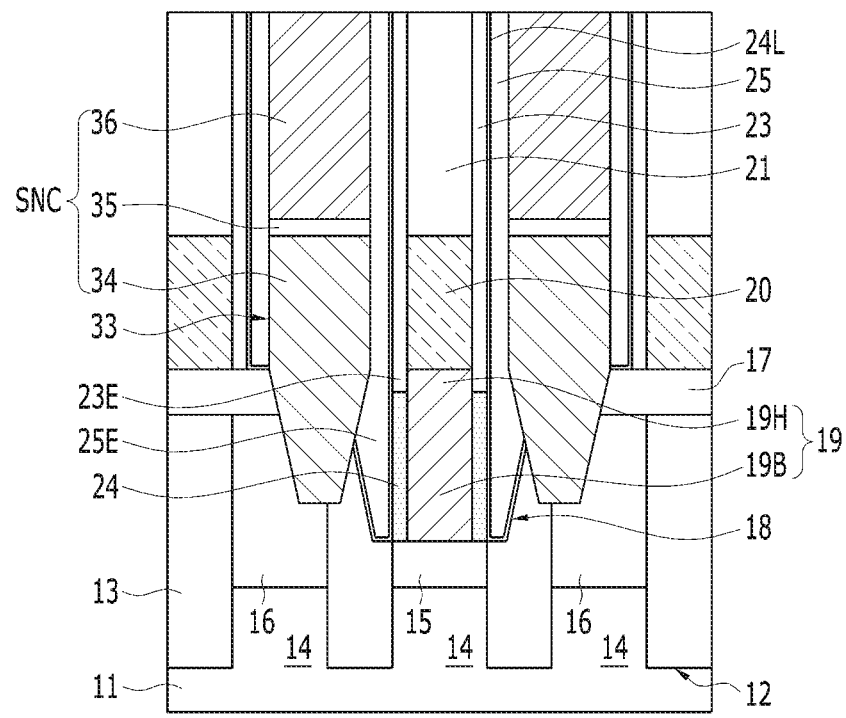

Subsequently, through the process illustrated in FIGS. 11A to 11E, a storage node contact plug SNC may be formed. In other words, as illustrated in FIG. 12E, the storage node contact plug SNC may include a silicon plug 34, a metal silicide layer 35, and a metal plug 36.

The second spacer 24, the liner spacer 24L, and the third spacer extended portion 25E may be disposed between the silicon plug 34 and the remaining plug body 19B. For example, an O—O—N (Oxide-Oxide-Nitride) structure may be formed between the silicon plug 34 and the remaining plug body 19B. As described above, since the second spacer 24 and the liner spacer 24L that are formed of a silicon oxide are disposed between the silicon plug 34 and the remaining plug body 19B, the parasitic capacitance between the silicon plug 34 and the remaining plug body 19B may be improved.

The semiconductor devices in accordance with the embodiments of the present invention may not be limited to DRAM devices, but may be applied to diverse kinds of memory devices, such as a Static Random Access Memory (SRAM), a flash memory, a Ferroelectric Random Access Memory (FeSRAM), a Magnetic Random Access Memory (MRAM), a Phase-Change Random Access Memory (PRAM) and the like.

According to the embodiments of the present invention, it is possible to prevent undercut from occurring on the interface between a bit line contact plug and a bit line.

According to the embodiments of the present invention, it is possible to improve the parasitic capacitance between the neighboring contact plugs.

According to the embodiments of the present invention, it is possible to improve electrical characteristics of a semiconductor device.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a substrate structure including a contact hole;
    filling the contact hole with a first conductive layer;
    forming a second conductive layer over the first conductive layer;
    forming a conductive line by etching the second conductive layer;
    etching a portion of the first conductive layer to form a plug head having the same critical dimension as the conductive line;
    forming a first spacer that covers the conductive line and the plug head;
    etching the remaining first conductive layer to form a plug body that is aligned with the first spacer, wherein the plug body have a greater critical dimension than the plug head; and forming a second spacer by performing a selective oxidation onto a side wall of the plug body.

2. The method of claim 1, further comprising:
forming a third spacer that covers the first spacer and the second spacer, after the forming of the second spacer.

3. The method of claim 2, wherein the first spacer and the third spacer are formed of a material that is different from a material of the second spacer.

4. The method of claim 1, wherein the first spacer and the second spacer are formed in the same thickness.

5. The method of claim 1, wherein after the selective oxidation, the plug body and the plug head have the same critical dimension.

6. The method of claim 1, wherein the first conductive layer includes a polysilicon layer, and the second spacer includes a silicon oxide.

7. The method of claim 1, wherein the first conductive layer includes a polysilicon layer, and the second conductive layer includes a metal material.

8. A method for fabricating a semiconductor device, comprising:
forming a substrate structure including a contact hole;
filling the contact hole with a first conductive layer;
forming a second conductive layer over the first conductive layer;
forming a bit line having a smaller critical dimension than a radius of the contact hole by etching the second conductive layer;
etching a portion of the first conductive layer to form a plug head having the same critical dimension as the bit line;
forming a first spacer that covers the bit line and the plug head;
etching a remaining portion of the first conductive layer to form a plug body having a greater critical dimension than the plug head and form a gap disposed on both sides of the plug body; and
forming a second spacer by performing a selective oxidation onto a side wall of the plug body.

9. The method of claim 8, further comprising:
forming a third spacer that covers the first spacer and the second spacer and fills the gap, after the forming of the second spacer.

10. The method of claim 9, wherein the third spacer is formed to be thicker than the first spacer and the second spacer.

11. The method of claim 9, wherein the first spacer and the third spacer are formed of a silicon nitride, and the second spacer includes a silicon oxide.

12. The method of claim 8, wherein the first spacer and the second spacer are formed in the same thickness.

13. The method of claim 8, wherein after the selective oxidation, the plug body and the plug head have the same critical dimension.

14. The method of claim 8, wherein the first conductive layer includes a polysilicon layer, and the second spacer includes a silicon oxide.

15. The method of claim 8, wherein the first conductive layer includes a polysilicon layer, and the conductive layer includes a metal material.

16. The method of claim 8, wherein the forming of the substrate structure including the contact hole includes:
forming an inter-layer dielectric layer over a semiconductor substrate;
forming an upper contact hole by etching the inter-layer dielectric layer; and
forming a lower contact hole by recessing the semiconductor substrate below the upper contact hole.

17. The method of claim 16, wherein the forming of the substrate structure including the contact hole further includes:
forming an active region and an isolation layer in the semiconductor substrate, before the forming of the inter-layer dielectric layer;
forming a gate trench that intersects with the active region and the isolation layer;
forming a gate insulating layer on a surface of the gate trench;
forming a buried word line that fills a portion of the gate trench over the gate insulating layer; and
forming a sealing layer over the buried word line.

18. The method of claim 9, further comprising:
forming a storage node contact plug to be adjacent to the plug body, the plug head, and the bit line, after the forming of the third spacer that covers the first spacer and the second spacer and fills the gap; and
forming a capacitor over the storage node contact plug.

19. The method of claim 18, wherein the storage node contact plug is formed by sequentially stacking a silicon plug, a metal silicide layer, and a metal plug.

20. The method of claim 8, further comprising:
forming a liner spacer that covers a side wall of the plug body, before the forming of the second spacer.

* * * * *